(12) United States Patent　　(10) Patent No.: US 9,134,378 B2
Gizdarski　　(45) Date of Patent: Sep. 15, 2015

(54) LINEAR DECOMPRESSOR WITH TWO-STEP DYNAMIC ENCODING

(71) Applicant: Synopsys, Inc., Mountain View, CA (US)

(72) Inventor: Emil I. Gizdarski, Cupertino, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/572,425

(22) Filed: Dec. 16, 2014

(65) Prior Publication Data

US 2015/0100841 A1　Apr. 9, 2015

Related U.S. Application Data

(63) Continuation-in-part of application No. 13/109,570, filed on May 17, 2011, now Pat. No. 8,914,695.

(60) Provisional application No. 61/452,528, filed on Mar. 14, 2011, provisional application No. 62/065,417, filed on Oct. 17, 2014.

(51) Int. Cl.
*G06F 11/00*　　(2006.01)
*G01R 31/28*　　(2006.01)
*G06F 9/455*　　(2006.01)
*G01R 31/3183*　(2006.01)
*G01R 31/3185*　(2006.01)
*G06F 11/263*　(2006.01)

(52) U.S. Cl.
CPC ..... *G01R 31/318342* (2013.01); *G01R 31/318385* (2013.01); *G01R 31/318547* (2013.01); *G06F 11/263* (2013.01)

(58) Field of Classification Search
CPC ............ G01R 31/318547; G01R 31/318502; G01R 31/318536; G01R 31/318541; G01R 31/318544; G01R 31/31813; G01R 31/318342; G06F 11/261; G06F 11/263; G06F 11/27; G06F 17/5045
USPC ......... 714/724–729, 733, 734, 738, 739, 741; 716/51, 101, 106, 110, 111, 136, 138
See application file for complete search history.

(56) References Cited

U.S. PATENT DOCUMENTS

| | | | |
|---|---|---|---|
| 7,590,905 B2 | 9/2009 | Abdel-Hafez et al. | |
| 7,925,947 B1 | 4/2011 | Touba et al. | |
| 7,956,772 B2 * | 6/2011 | Shokrollahi et al. | 341/51 |
| 7,996,741 B2 | 8/2011 | Touba et al. | |
| 8,166,359 B2 | 4/2012 | Rajski et al. | |
| 8,407,541 B1 * | 3/2013 | Teh et al. | 714/726 |
| 8,566,656 B2 * | 10/2013 | Zivkovic et al. | 714/726 |
| 2012/0311009 A1 * | 12/2012 | Jarrett et al. | 708/700 |

\* cited by examiner

*Primary Examiner* — Christine Tu
(74) *Attorney, Agent, or Firm* — Park, Vaughan, Fleming & Dowler LLP; Laxman Sahasrabuddhe

(57) ABSTRACT

Methods and apparatuses for generating compressed test data for use by a tester, decompressing the test data during test, and routing the decompressed test data into a set of scan chains within a circuit under test are described.

18 Claims, 28 Drawing Sheets

LINEAR DECOMPRESSOR WITH TWO-STEP DYNAMIC ENCODING

RELATED APPLICATIONS

This application is a continuation-in-part of, and claims priority to, U.S. application Ser. No. 13/109,570 (U.S. Pat. No. 8,914,695 issued on 16 Dec. 2014), entitled "Synthesizing Circular Decompressors," by the same inventor, filed on 17 May 2011, the contents of which are herein incorporated by reference in their entirety for all purposes. U.S. application Ser. No. 13/109,570 (U.S. Pat. No. 8,914,695 issued on 16 Dec. 2014) claims benefit of U.S. Provisional Application No. 61/452,528, entitled "Method and Apparatus for Synthesizing Circular Decompressors," by the same inventor, filed on 14 Mar. 2011, the contents of which are herein incorporated by reference in their entirety for all purposes.

This application also claims benefit of U.S. Provisional Application No. 62/065,417, entitled "Augmented Decompressor," by the same inventor, filed on 17 Oct. 2014, the contents of which are herein incorporated by reference in their entirety for all purposes.

BACKGROUND

1. Technical Field

This disclosure generally relates to circuit testing. More specifically, this disclosure relates to circuitry for test stimulus decompression.

2. Related Art

Electronic design automation (EDA) is used by the semiconductor industry for virtually all integrated circuit (IC) design projects. More specifically, after developing a product idea, EDA tools are used to define a specific implementation. The implementation defined using the EDA tools is then used to create mask data, which is subsequently used for producing masks in the production of the finished chips, in a process referred to as "tape-out." The physical masks are then created and used with fabrication equipment to manufacture IC wafers. Testing is typically performed on the IC wafers to identify defective wafers. Next, diagnosis is applied to the defective wafers to identify root-causes for systematic defects, wherein the identified root-causes are used for mask correction in order to improve manufacture yield. Finally, the wafers are diced, packaged and assembled to produce IC chips for distribution.

An IC design flow using EDA tools typically begins with an overall system design using architecture defining tools that describe the functionality of the product to be implemented by the IC. Next, logic design tools are applied to the overall system description to create a high-level description based on description languages such as Verilog or VHDL, and functional verification tools are applied on the high-level description in an iterative process to ensure that the high-level description accomplishes the design objectives. Next, synthesis and design-for-test tools are used to translate the high-level description to a netlist, optimize the netlist for target technology, and design and implement tests that permit checking of the finished chip against the netlist.

The typical design flow might next include a design planning stage, wherein an overall floor plan for the chip is constructed and analyzed to ensure that timing parameters for the netlist can be achieved at a high level. Next, the netlist may be rigorously checked for compliance with timing constraints and with the functional definitions defined at the high level using VHDL or Verilog. After an iterative process which settles on a netlist and maps the netlist to a cell library for the final design, a physical implementation tool is used for placement and routing. Specifically, the physical implementation tool includes a placement tool for positioning circuit elements on the layout, and a routing tool for defining interconnects for the circuit elements.

The components defined after placement and routing are typically analyzed at the transistor level using an extraction tool, and verified to ensure that the circuit function is achieved and timing constraints are met. The placement and routing process can be revisited as needed in an iterative manner. Next, the design is subjected to physical verification procedures, such as design rule checking (DRC), layout rule checking (LRC) and layout versus schematic (LVS) checking, that analyze manufacturability, electrical performance, lithographic parameters and circuit correctness.

After settling on an acceptable design by iteration through design and verification steps, such as those described above, the resulting design can be subjected to resolution enhancement techniques that provide geometric manipulations of the layout to improve manufacturability. Finally, the mask data is prepared and taped-out for use in producing finished products.

An IC generated from the above-described design flow typically includes circuitry that allows the finished product to be tested. Note that efficient testing of ICs often uses structured design for testability (DFT) techniques. In particular, these techniques may be based on the general concept of making all or some state variables (e.g., memory elements such as flip-flops and latches in the circuit) directly controllable and observable. One of the well-known DFT techniques is based on scan chains. This technique assumes that during testing all (or substantially all) memory elements are coupled together to form one or more shift registers. As a result, a logic circuit in an IC design can have two or more modes of operation, including a normal mode and a test (or scan) mode. In the normal mode, the memory elements perform their regular design functions. In the scan mode, the memory elements become scan cells that are coupled to form the one or more shift registers which are often referred to as "scan chains." During the scan mode, these scan chains are used to shift the test stimulus into a circuit under test (CUT) and shift out test responses. More specifically, the scan mode involves applying a test pattern to the scan chains, which further includes scanning in the test stimulus, applying one or more functional clocks, and then scanning out the captured test response. The test responses are then compared with fault-free test responses to determine whether the CUT works properly.

Scan-based design techniques have been widely used to simplify testing and diagnose ICs. From the viewpoint of automatic test pattern generation (ATPG), a scan circuit can be treated as a combinational or partially combinational circuit. Currently, ATPG tools are capable of generating a complete set of test patterns based on different fault models, including stuck-at, transition, path delay, and bridging faults. Typically, when a particular fault in a CUT is targeted by an ATPG tool, only a small number of scan cells needs to be specified and one scan cell needs to be observed in order to detect this particular fault.

Note that in order to reduce test data volume and test application time, scan-based design techniques typically generate a compacted test stimulus and compacted test response rather than loading the entire test stimulus and unloading the entire test response. FIG. 1 presents a block diagram illustrating an IC 100 having an on-chip test compression capability. As is illustrated in FIG. 1, a tester 102 is coupled to IC 100 which comprises a CUT 104 which further includes a set of M scan chains, a decompressor 106, and a compressor 108.

Decompressor 106 is configured to receive the compacted test stimulus from tester 102 and expand the compacted test stimulus to fill the M scan chains in CUT 104. Compressor 108 is configured to compress the test responses from the M scan chains and send the compacted test responses to tester 102.

FIG. 2 illustrates a number of conventional linear or non-linear decompressor schemes. Generally, decompressor schemes can be classified as either combinational or sequential. A combinational decompressor, for example decompressor 202, comprises a combinational block 204 typically including XOR, NXOR, and MUX gates such that the loaded test stimuli of each scan chain are derived as a logic function of tester channels. This design scheme uses simple hardware and control logic. However, the drawback of this scheme is that combinational decompressors have to encode all specified care bits in the test stimulus in one shift cycle using only test data bits (or variables) supplied from the tester for this shift cycle (typically comprising one test data bit for each tester channel). This drawback can seriously limit the achievable compression ratio for the most highly specified shift cycles because the number of tester channels needs to be sufficiently large to encode the most highly specified shift cycles.

Sequential decompressors are based on linear finite state machines such as shift registers, linear feedback shift registers (LFSRs), cellular automata, or ring generators. For example decompressor 206 which comprises a shift register 208 and a combination block 210 is illustrated in FIG. 2. The sequential decompressors allow variables from earlier shift cycles to be used for encoding care bits in the current shift cycle. This property allows the sequential decompressors to provide much higher encoding flexibility than the combinational decompressors, and also helps to avoid the problem of the most highly specified shift cycles associated with the combinational decompressors. More recently, sequential linear decompressor designs often include a phase shifter placed between the scan chains and the LFSR or the ring generator to further improve encoding efficiency. One such example, decompressor 212 comprising a LFSR 214 and a phase shifter 216, is illustrated in FIG. 2.

Typically, a decompressor (either combinational or sequential) receives test data bits supplied by the tester represented by a set of variables $\{v_0, v_1, \ldots, v_{n-1}\}$ and attempts to generate a test sequence C comprising a set of specified care bits $\{c_0, c_1, \ldots, c_{m-1}\}$, which is also referred to as a "test cube." This process is often referred to as "encoding" a test cube. A decompressor can generate the test cube C if and only if there exists a solution to a system of linear equations AV=C, wherein A is an n×m characteristic matrix specifying the decompressor, and V is the set of variables $\{v_0, v_1, \ldots, v_{n-1}\}$. (The characteristic matrix for a decompressor is typically derived by symbolic simulation of the decompressor such that each symbol represents one variable.) Hence, encoding a test cube using a decompressor requires solving a system of linear equations of the set of variables which is composed of one linear equation for each care bit. If no solution exists, then the test cube is considered "unencodable." Note that it is difficult to encode a test cube that has more care bits than the number of available variables (or test data bits). However, if the number of variables is sufficiently larger than the number of care bits in the test cube, the probability of not being able to encode the test cube becomes negligibly small. For an LFSR with a primitive polynomial, if the number of variables is 20 more than the number of specified care bits, then the probability of not finding a solution (or an encoding conflict) is often less than $10^{-6}$.

On the other hand, the conventional sequential linear decompressor based on LFSRs or ring generators can imply very complex dependencies because each scan cell in the CUT can depend on the XOR of a large number of variables. Incorporating such complex dependencies in the ATPG implication process can greatly increase the computational complexity of the ATPG. For example, consider a scan cell whose state depends on q variables. In order to justify a particular state at this scan cell, q variables need to be assigned, and the number of possible ways to assign each variable with a value of 0 or 1 would be $2^q-1$. As q increases, this computational complexity grows exponentially. For this reason, the conventional sequential linear decompressors based on LFSRs or ring generators typically do not attempt to directly include the dependencies in the ATPG implication process. Because of this limitation, the conventional sequential linear decompressors do not fully utilize the degree of freedom in the ATPG.

Hence, it is desirable to design a decompressor which has the following properties: 1) a very high encoding efficiency; 2) a flexible mechanism to receive as many variables as needed; 3) a computationally efficient encoding process that can be directly incorporated into the ATPG implication process; and 4) an ability of the encoding process to extract as many as possible (or all) necessary state assignments due to dependency in the decompressor scheme.

SUMMARY

Some embodiments feature techniques and systems to calculate static seeds and dynamic seeds to generate care bits for detecting faults in CUT. During operation, the embodiments can receive an IC that includes a set of registers, a linear expander, and the CUT, wherein the linear expander generates the care bits based on data stored in the set of registers and scans the care bits into a set of scan chains in the CUT, wherein the care bits are divided into a set of static care bits and a set of dynamic care bits, wherein the static care bits are encoded by using a first system of linear equations based on static seeds, wherein the dynamic care bits are encoded by using a second system of linear equations based on dynamic seeds, and wherein the first system of linear equations includes an augmented equation for each static care bit which is determined by superposing linear equations of the static care bit and at least one corresponding dynamic care bit. Next, the embodiments can calculate the static seeds based on the static care bits and the first system of linear equations. The embodiments can then calculate the dynamic seeds based on the dynamic care bits and the second system of linear equations.

Some embodiments can identify encoding conflicts based on the second system of linear equations. Some embodiments can prevent encoding conflicts based on the second system of linear equations.

Some embodiments can store the calculated static seeds and dynamic seeds in a database. In these embodiments, a tester can subsequently read the static seeds and the dynamic seeds from the database, write the static seeds and the dynamic seeds to the set of registers, and test the CUT based on the static seeds and the dynamic seeds stored in the set of registers. In some embodiments, the IC includes a shadow register, and wherein writing the static seeds and the dynamic seeds to the set of registers can involve iteratively writing each static seed and each dynamic seed into the shadow register, and transferring the contents of the shadow register to a distinct register in the set of registers in each iteration.

Some embodiments feature techniques and systems to add test circuitry to a circuit design. Specifically, the embodiments can receive a circuit design that includes a circuit under test (CUT), and add circuitry to the circuit design to decompress test data from a tester and route the decompressed test data into a set of scan chains within the CUT. Specifically, the decompressor circuitry can comprise (1) a set of registers comprising at least a first register and a second register, wherein the first register stores static seeds from the test and the second register stores dynamic seeds, wherein care bits are divided into a set of static care bits and a set of dynamic care bits, wherein the static care bits are associated with a first system of linear equations based on static variables and the dynamic care bits are associated with a second system of linear equations based on dynamic variables, and wherein an augmented equation of the first system of linear equation is determined by a superposition of a static care bit and a corresponding dynamic care bit; and (2) a linear expander to generate the decompressed test data based on the dynamic seeds and static seeds stored in the registers. Each output of the linear expander can be coupled to a scan chain in the set of scan chains. Furthermore, the first register and the second register can be configured to receive the static seeds and the dynamic seeds, respectively, from a tester through a shadow-register.

In some embodiments, encoding conflicts can be identified based on the second system of linear equations. In some embodiments, encoding conflicts can be prevented based on the second system of linear equations. Some embodiments can identify encoding conflicts during automatic test pattern generation, calculate static seeds based on static care bits and static variables, determine cell assignments during constrained initial encoding, and calculate dynamic seeds based on dynamic care bits and dynamic variables.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Some embodiments feature a class of decompressor designs, referred to as "circular decompressors," which can provide both high encoding efficiency and high flexibility for the tester to supply test data bits by selective partial reseeding. The decompressor designs also facilitate an efficient implication process which is capable of dynamically avoiding and handling encoding conflicts due to a dependency in a decompressor scheme.

Decompressor Design Based on Multiple Circular Shift Registers

Figure 1:
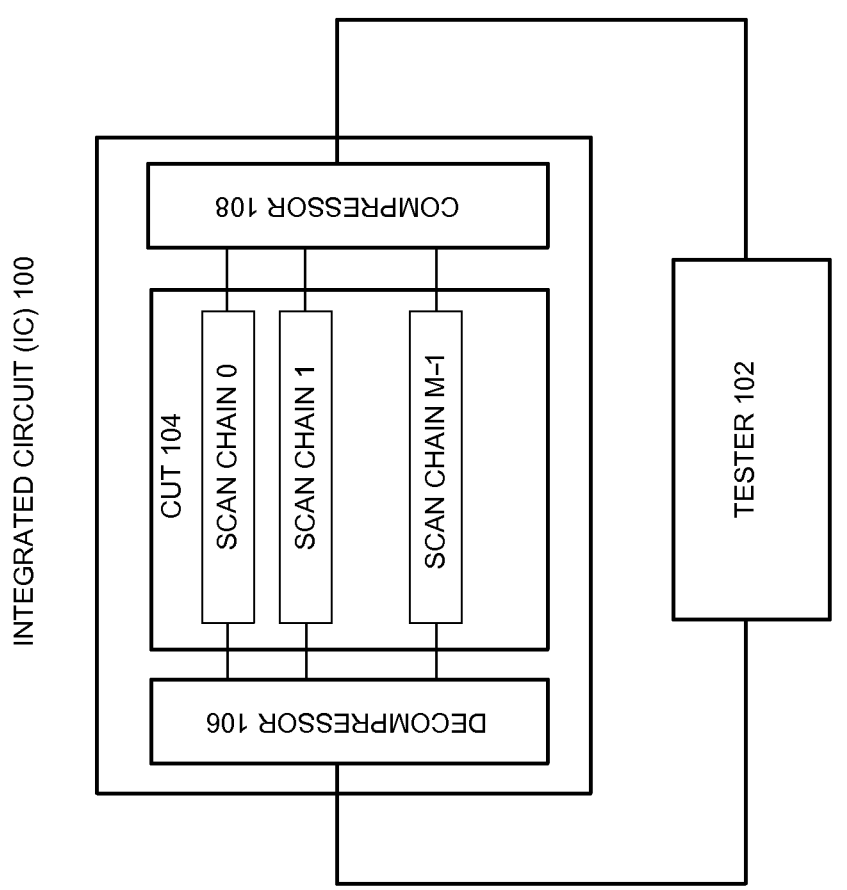
FIG. 1 presents a block diagram illustrating an IC 100 having an on-chip test compression capability.
Figure 2:
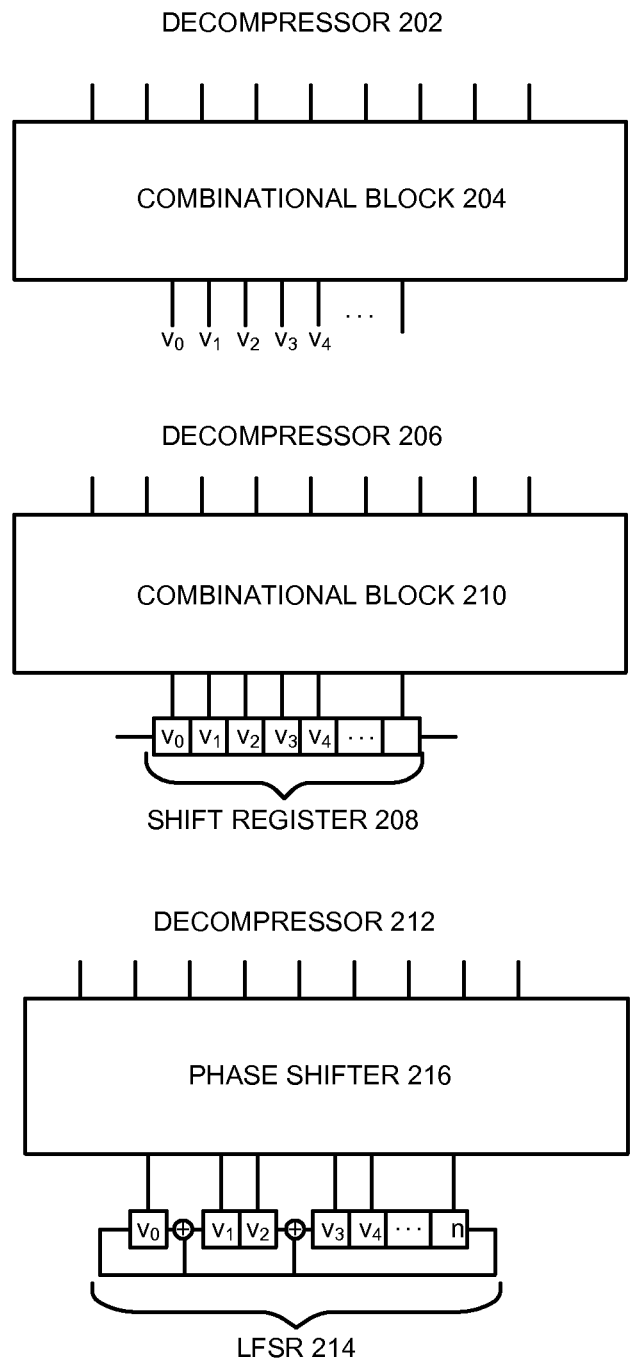
FIG. 2 illustrates a number of conventional decompressor schemes.
Figure 3:
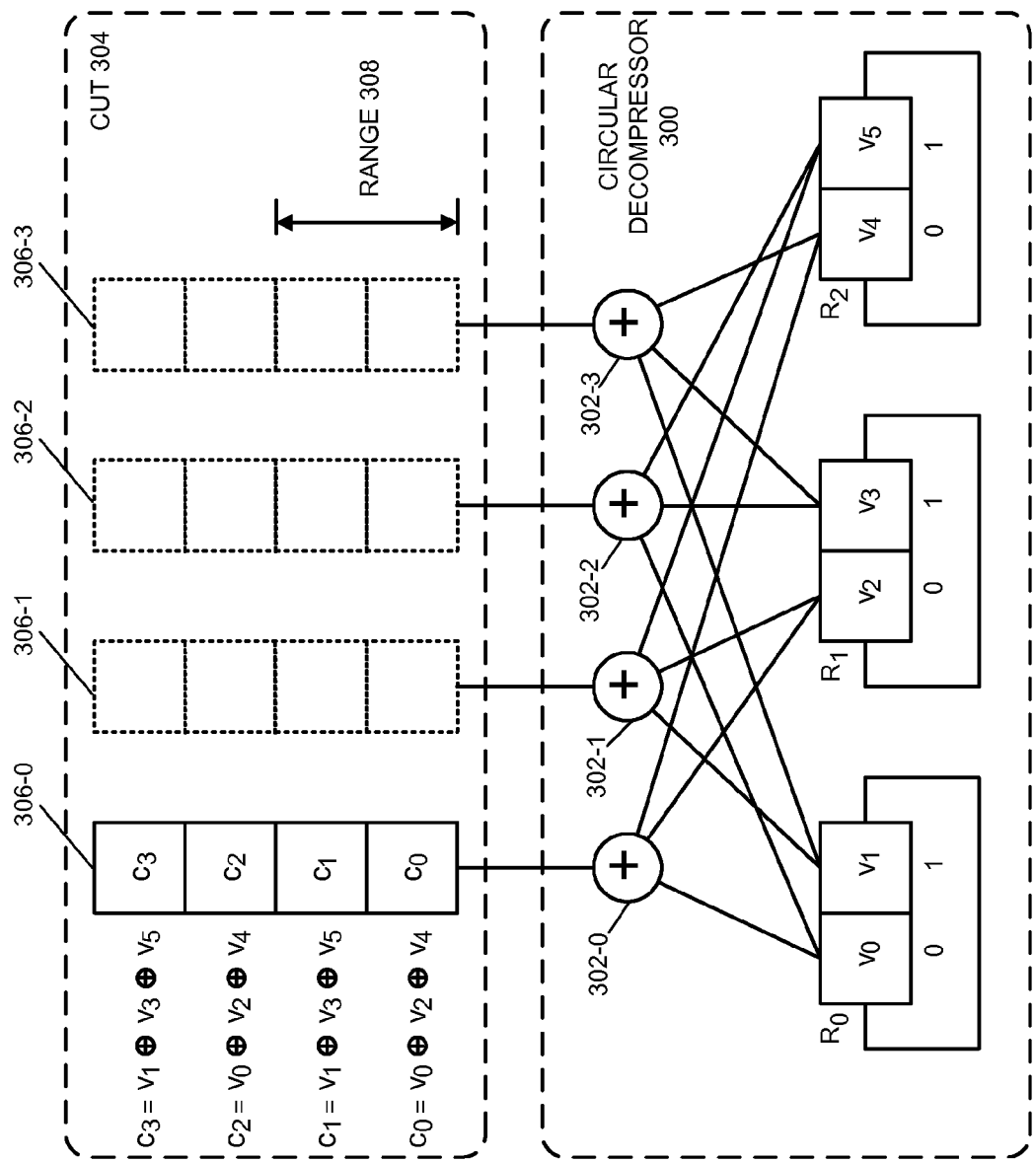
FIG. 3 illustrates an exemplary circular decompressor in accordance with some embodiments described herein.

FIG. 3 illustrates an exemplary circular decompressor 300 in accordance with some embodiments described herein. As illustrated in FIG. 3, circular decompressor 300 comprises three shift registers $R_0$, $R_1$ and $R_2$ of length two. Moreover, each shift register is configured as a circular shift register such that each sequential element in each shift register receives test data from exactly one predecessor (sequential element) and supplies test data to exactly one successor (sequential element). Note, however, that other embodiments can use greater or fewer than three shift registers and/or greater or fewer than two sequential elements in each shift registers. In another embodiment, only a subset of shift registers in decompressor 300 is configured as circular registers.

Circular decompressor 300 additionally includes a set of four XOR gates 302-0 to 302-3 coupled between the shift registers and a set of four scan chains 306-0 to 306-3, all four scan cells in length, in a CUT 304. In particular, each scan chain 306 receives decompressed test data from a unique XOR gate 302 in the set of XOR gates. Note that other embodiments can use greater or fewer than four scan chains and/or greater or fewer than four scan cells in each scan chain.

For simplicity, let's assume that the shift registers in decompressor 300 shift compressed test data and the scan chains 306 shift decompressed test data with the same speed. As a result, each shift register defines a unique two-group partition of scan chains 306 such that each sequential element in each shift register can be associated with a group of the corresponding partition. For example, shift register $R_0$ defines partitions (306-0, 306-2) corresponding to the sequential element 0 in $R_0$ and partitions (306-1, 306-3) corresponding to sequential element 1 in $R_0$. Similarly, shift register $R_1$ defines partitions (306-0, 306-1) corresponding to sequential element 0 in $R_1$ and partitions (306-2, 306-3) corresponding to sequential element 1 in $R_1$. Consequently, each scan cell in each scan chain is related to three different groups from the three different partitions defined by shift registers $R_0$, $R_1$ and $R_2$. In the embodiment shown, the sequential elements of the shift registers are associated with six input variables $\{v_0, v_1, \ldots, v_5\}$, wherein each variable corresponds to one test data bit. Based on the above-described grouping and partitioning, a characteristic equation of each scan cell can be conveniently derived as an XOR operation of three variables associated with the three groups from the three partitions defined by shift registers $R_0$, $R_1$ and $R_2$. For example, the characteristic equations for scan cells $c_0$, $c_1$, $c_2$ and $c_3$ of the leftmost scan chain 306-0 are shown in FIG. 3. Note that characteristic equations can be represented by a binary matrix having values 0 and 1 based on whether the corresponding variable is or is not present in the characteristic equation.

Moreover, the decompressed test stimulus can be computed based on initial states of all variables $\{v_0, v_1, \ldots, V_5\}$ specified by a seed. Typically, it is assumed that the set of care bits in a test cube is specified during the ATPG, wherein the test cube can be represented by a system of linear equations. As described previously, the test cube is encodable if the corresponding system of linear equations has a solution. Note that the encoding efficiency of the decompressor design can be affected by the presence of linearly dependent scan cells in the set of scan chains. For example, an encoding conflict occurs when a set of linearly dependent scan cells contains an odd number of 1's. Hence, decreasing the number of linearly dependent scan cells often can greatly improve the encoding efficiency of a decompressor design. In one embodiment, a decompressor "range," such as range 308 illustrated in FIG. 3, is used to define a minimum number of consecutive shift cycles during which every pair of scan cells is linearly independent.

More specifically, a set of scan cells is regarded as linearly dependent if a superposition of the corresponding characteristic equations equals 0. This condition can occur if all variables appear even times in the corresponding characteristic equations. In the example of FIG. 3, range 308 of circular decompressor 300 equals two, and a pair of scan cells in a given scan chain separated by exactly one scan cell have the same characteristic equations. The number of scan cells within decompressor range 308 equals $N^3$ (N=2), which is the product of the lengths of all three shift registers. Note that for the exemplary decompressor 300, any four scan cells in one shift cycle are linearly independent. Also, any three scan cells in the decompressor range are linearly independent.

In one embodiment, the procedure (Procedure 1) for synthesizing a circular decompressor associated with $N^2$ scan chains includes the following steps:
1) assign a unique 2-tuple (x, y) to each scan chain where x=(0, 1, ..., N−1) and y=(0, 1, ..., N−1);
2) add three shift registers $R_0$, $R_1$ and $R_2$ of length N;
3) for each of the shift registers, assign values 0, 1, ..., N−1 to each sequential element starting from left to right; and
4) couple scan chain (x, y) to sequential elements a, b and c in shift registers $R_0$, $R_1$ and $R_2$, respectively, wherein a=x, b=y and c=(x+y) mod N.

Note that Procedure 1 can be used to establish the illustrated coupling between the set of scan chains 306 and the set of shift registers $R_0$, $R_1$ and $R_2$.

Figure 4:
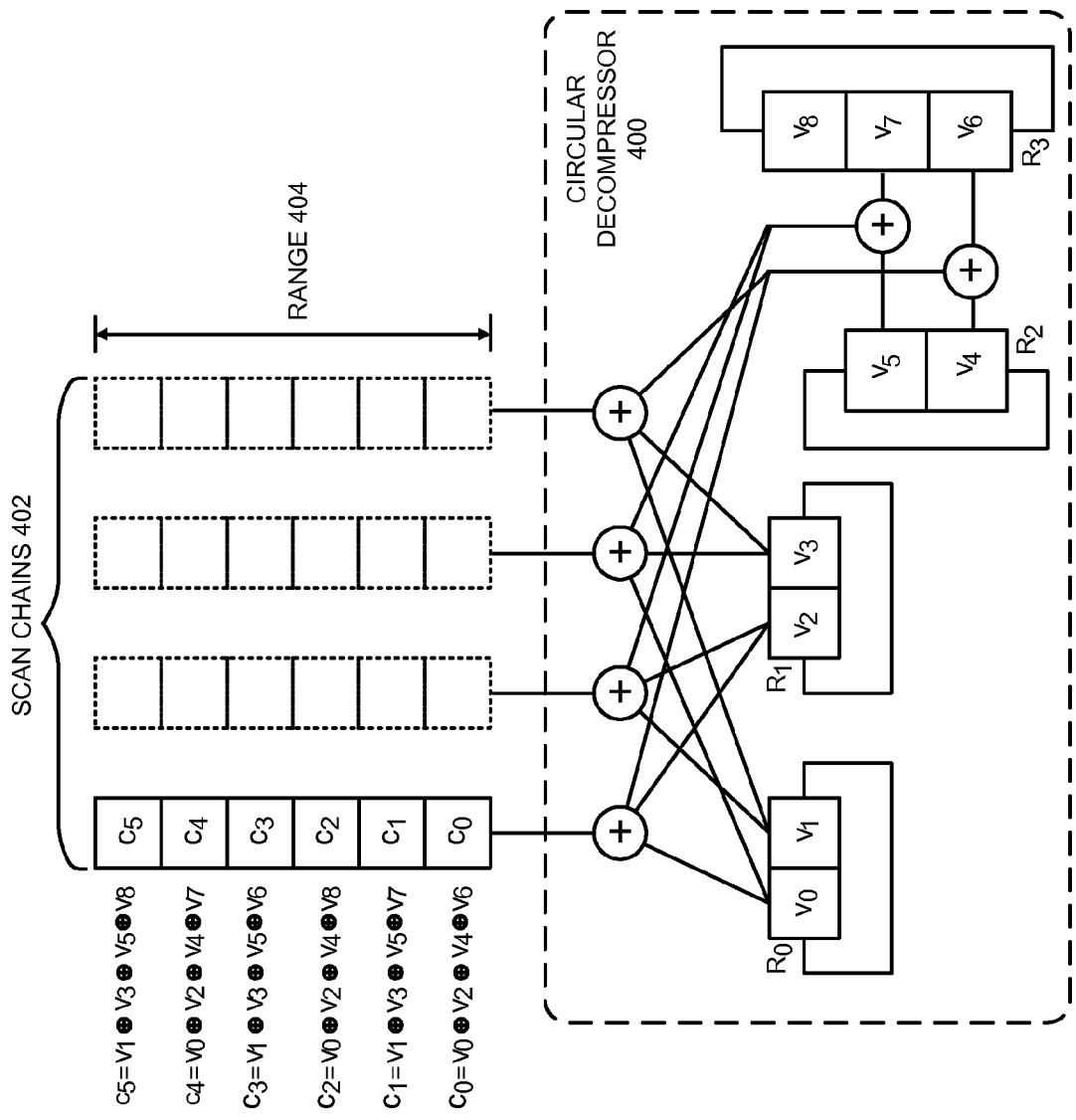
FIG. 4 illustrates an exemplary circular decompressor having three shift registers $R_0$, $R_1$, $R_2$ of length N and one shift register $R_3$ of length M (M and N are relative prime) in accordance with some embodiments described herein.

FIG. 4 illustrates an exemplary circular decompressor 400 having three circular shift registers $R_0$, $R_1$, $R_2$ of length N and one circular shift register $R_3$ of length M (M and N are relative prime) in accordance with some embodiments described herein. Note that the $N^2$ scan chains 402 are coupled to circular shift registers $R_0$, $R_1$ and $R_2$ in a manner such that each of the sequential elements in the three circular shift registers $R_0$, $R_1$, $R_2$ is coupled to a unique group of scan chains in scan chains 402. In other words, no two sequential elements in registers $R_0$, $R_1$, $R_2$ are coupled to the same group of scan chains. This property can be achieved by synthesizing registers $R_0$, $R_1$, $R_2$ based on Procedure 1.

In one embodiment, the fourth circular shift register $R_3$ in circular decompressor 400 can be coupled to the set of scan chains 402 by first XORing with any one of registers $R_0$, $R_1$ and $R_2$. For example, the example of FIG. 4 illustrates that register $R_3$ is coupled to scan chains 402 by first XORing with individual sequential elements in registers $R_2$ and $R_3$. As a result, the sequential elements of shift registers $R_2$ and $R_3$ are coupled to same groups of scan chains. Note that shift registers $R_2$ and $R_3$ have relatively prime lengths. In other words, M and N are relative prime with the greatest common divisor between them equal to 1. In this embodiment, the decompressor range 404 is determined by a product of lengths M and N (i.e., 6). Note that while M=3 and N=2 in the example shown, M and N can take on other values as long as they are relatively prime. For example, if M=5 and N=2, the decompressor range 404 becomes 10. As a result, the number of scan cells in the decompressor range 404 equals $MN^3$, i.e., a product of the lengths of all shift registers. Note that in the embodiment of FIG. 4, any four scan cells in one shift cycle are linearly independent. Also, any three scan cells in the decompressor range are linearly independent.

Figure 5:
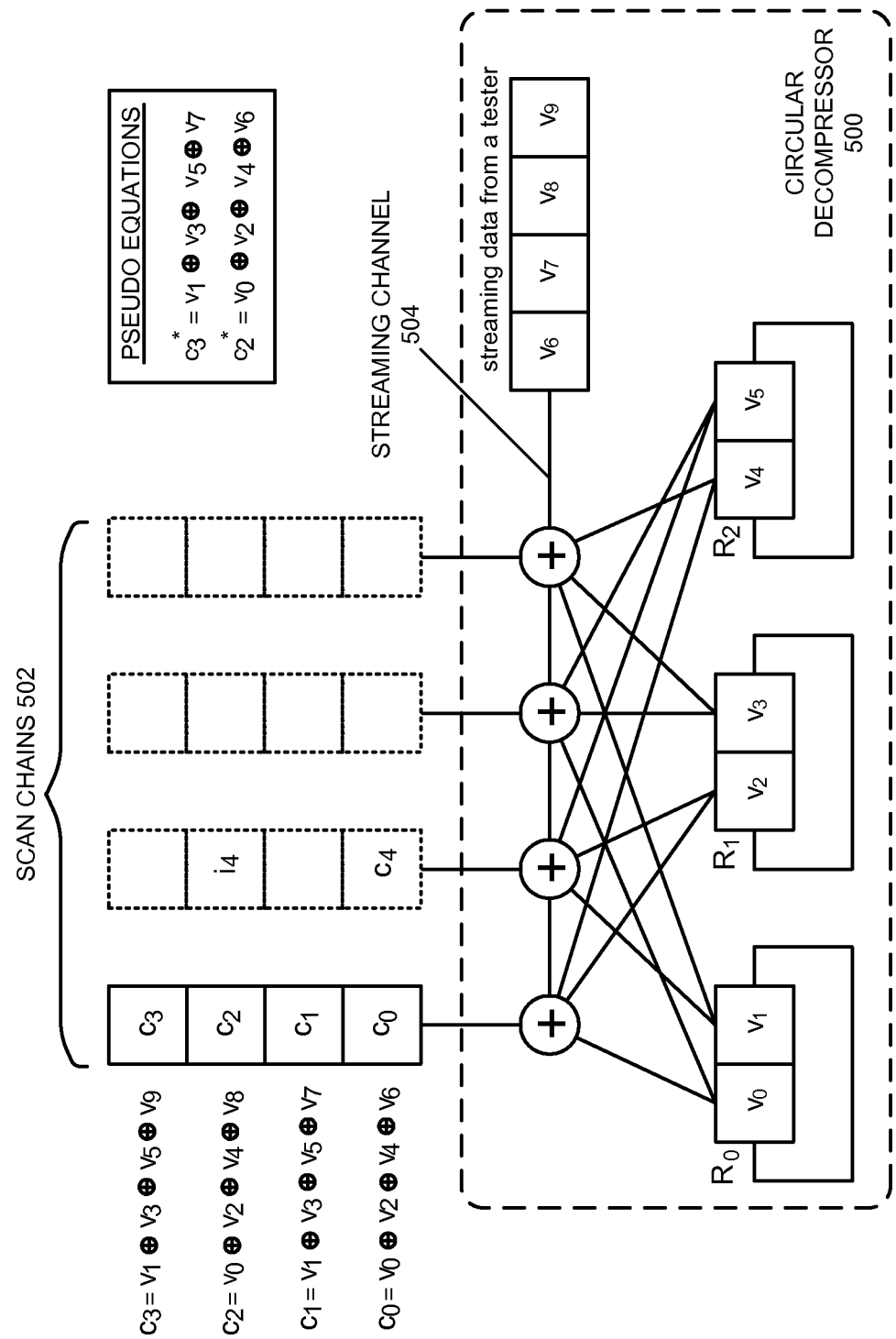
FIG. 5 illustrates an exemplary circular decompressor with dynamic reseeding in accordance with some embodiments described herein.

FIG. 5 illustrates an exemplary circular decompressor 500 with dynamic reseeding in accordance with some embodiments described herein. Similar to the previously described embodiments, decompressor 500 comprises three shift registers $R_0$, $R_1$ and $R_2$ of length N coupled to $N^2$ scan chains 502, which can also be established based on Procedure 1. Note that decompressor 500 also includes a streaming channel 504 which provides an extra test data bit per shift cycle from the tester to the scan chains 502. In this embodiment, the decompressor range is infinite, and the generated decompressed test stimulus can be viewed as a superposition of a periodic (static) test sequence (shifted in from $R_0$, $R_1$ and $R_2$) and a streaming (dynamic) test sequence comprising one test data bit per shift cycle. Accordingly, during the ATPG, the encoding process of decompressor 500 can be decomposed into a static encoding process and a dynamic encoding process associated with the above-mentioned two test sequences.

More specifically, based on test variables $v_0, v_1, \ldots, v_7$, the static encoding process maps each care bit in a window of P shift cycles using pseudo characteristic equations for scan cells outside this window, wherein P=N is the decompressor range. Pseudo characteristic equations for scan cells $c_2$ and $c_3$ (denoted as $c_2^*$ and $c_3^*$) are shown in the right-hand side of FIG. 5. Furthermore, the static encoding process checks whether the last care bit is encodable, i.e., consistent with all previous care bits. Separately, based on variables $v_8$ and $v_9$, the dynamic encoding process can resolve up to one encoding conflict per shift cycle and derive implications (necessary assignments) based on a condition that for a pair of shift cycles which are equivalent based on modulo P, corresponding pairs of scan cells belonging to each scan chain must be set either to equal or different states. In this manner, the characteristic matrix can be decomposed into two systems of linear equations that may be treated independently.

To illustrate the dynamic encoding process in more detail, let's assume that there are five care bits $c_0, c_1, \ldots, c_4$ to be determined by the test generation process and the last care bit $c_4$ is checked as encodable by the static encoding process. Next, variable $v_8$ is set to either 0 or 1 if care bits $c_0$ and $c_2$ have equal or different states, respectively. Moreover, variable $v_9$ is set to either 0 or 1 if care bits $c_1$ and $c_3$ have equal or different states, respectively. These preconditions imply that the state of scan cell $i_4$ equals $c_4 \oplus v_8$ in order to satisfy equation $c_0 \oplus c_2 \oplus c_4 \oplus i_4 = 0$, because scan cells $c_0$, $c_2$, $c_4$ and $i_4$ belong to a pair of scan chains in shift cycles which are equivalent based on modulo P. The described embodiment provides a mechanism for deriving most of the necessary assignments based on dependencies introduced by the decompressor design of FIG. 5, thus improving the efficiency of the implication process and the merging process during the ATPG. The same technique can be extended to a decompressor circuit having two or more streaming channels and to other decompressor designs involving dynamic reseeding.

Figure 6:
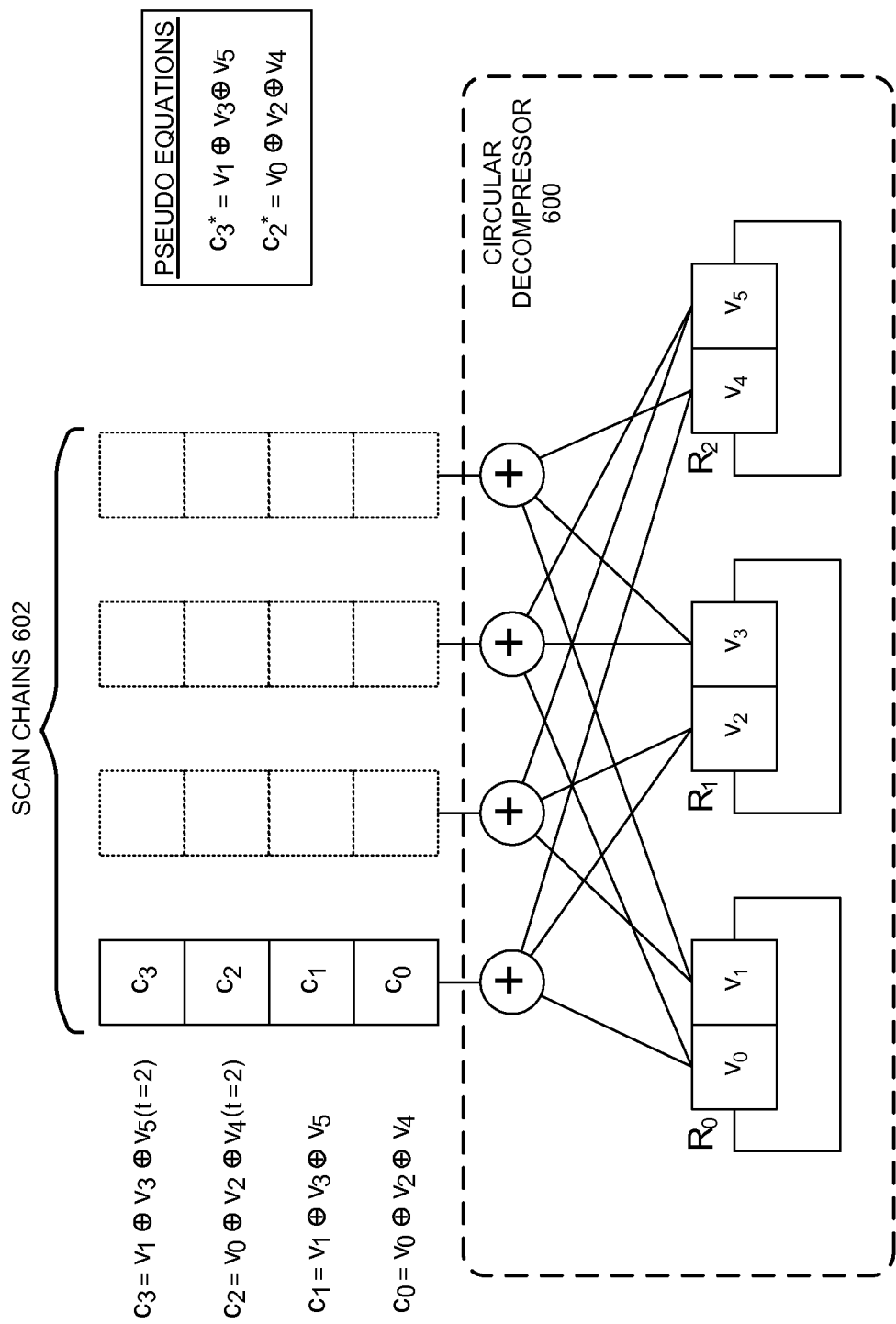
FIG. 6 illustrates an exemplary circular decompressor with dynamic partial reseeding in accordance with some embodiments described herein.

FIG. 6 illustrates an exemplary circular decompressor 600 with dynamic partial reseeding in accordance with some embodiments described herein. Again, the illustrated decompressor 600 comprises three shift registers $R_0$, $R_1$ and $R_2$ of length N coupled to $N^2$ scan chains 602 based on Procedure 1. In this embodiment, the dynamic partial reseeding is achieved by reseeding register $R_2$ every N shift cycles. To reflect this modification, a parameter t is added to variables $v_4(t)$ and $v_5(t)$ where t is a positive integer equal to 0, N, 2N, .... Note that this embodiment provides higher flexibility than the above-described streaming channel techniques because: 1) each streaming test data bit in the streaming channel is dedicated to a specific shift cycle, while in the dynamic partial reseeding, each test data bit has an impact on multiple shift cycles; and 2) the amount of streaming test data bits is fixed by the number of streaming channels, while the dynamic partial reseeding in FIG. 6 may be enhanced to allow a selective partial reseeding for one or more shift registers as needed.

Figure 7:
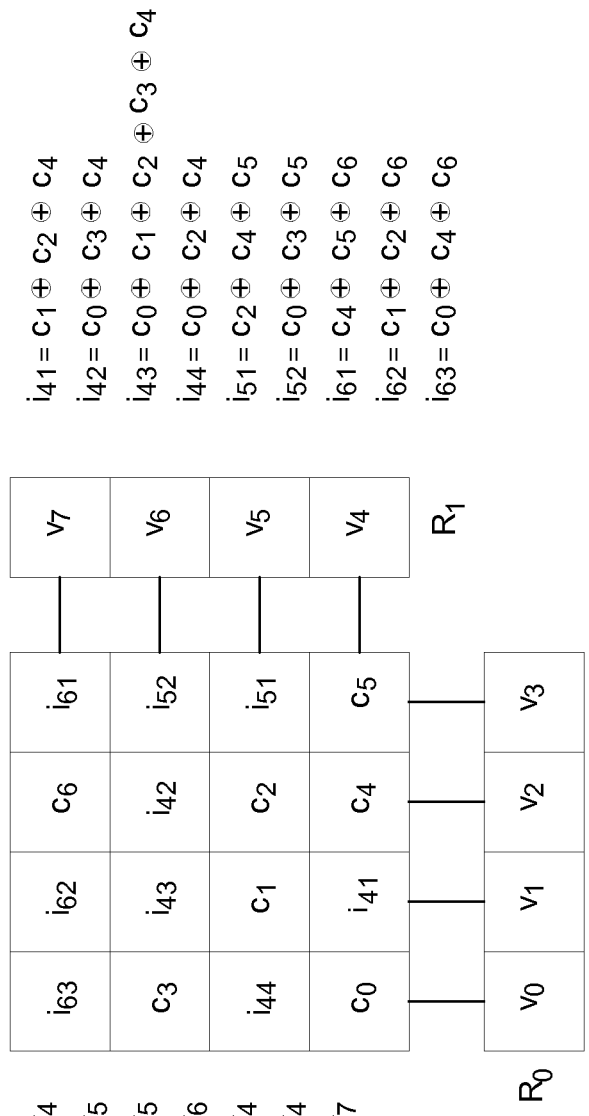
FIG. 7 illustrates a dynamic encoding for a circular decompressor constructed according to a proposed procedure when two pre-selected shift registers $R_0$ and $R_1$ are reseeded every N (N=4) shift cycles in accordance with some embodiments described herein.

FIG. 7 illustrates a dynamic encoding of a circular decompressor constructed according to Procedure 1 when two preselected shift registers $R_0$ and $R_1$ are reseeded every N (N=4) shift cycles in accordance with some embodiments described herein. As is illustrated in FIG. 7, two mutually orthogonal partitions of scan chains defined by registers $R_0$ and $R_1$ divide scan cells into $N^2$ equivalent classes such that N equivalent scan cells belong to the same group in both partitions. During the ATPG, a set of variables $v_0, v_1, \ldots, v_{2N-1}$ is assigned to the sequential elements of both shift registers. A set of care bits $c_0, c_1, \ldots, c_6$ is shown in FIG. 7 wherein the index of each care bit determines an order for these care bits. The characteristic equations of the first four care bits which are valid for all equivalent scan cells are shown in FIG. 7. Accordingly, each care bit implies that all equivalent scan cells contain the same in the dynamic test sequence.

In the embodiment of FIG. 7, four scan cells located at the intersections of a pair of rows with a pair of columns (referred to as a "quadruple") are linearly dependent because each one of the corresponding four variables appears twice in the characteristic equations of the quadruple scan cells. To avoid encoding conflict, any quadruplet of linearly dependent scan cells must contain an even number of 1's. Next, implications derived from care bits $c_a$ are marked as $i_{ab}$ for each a=0, 1, ..., 6. These implications are derived based on the above condition. In other words, the states in any three care bits of a quadruplet determine the state in the fourth scan cell such that the four scan cells should contain an even number of 1's. As is illustrated in FIG. 7, implications are likely to exist after the first N care bits. Furthermore, each care bit implies the states of N equivalent scan cells in the dynamic test sequence, but the probability that a pair of scan cells is equivalent rapidly decreases for a large N. Under the assumption that a small set of scan cells is involved in the test generation process, for a target fault the impact of the dynamic implications to avoid encoding conflicts is likely to be moderate. Similarly, the presented approach may be extended for deriving implications between more than two mutually orthogonal partitions.

Figure 8:
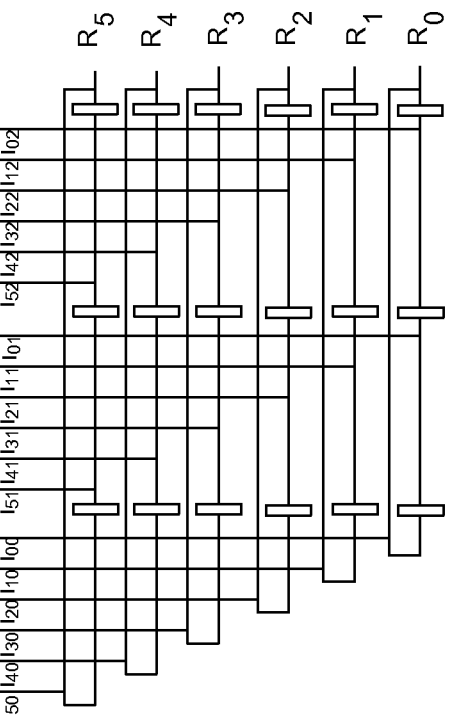
FIG. 8 presents a block diagram of an augmented circular decompressor (N, K, V) in accordance with some embodiments described herein.

FIG. 8 presents a block diagram of an augmented circular decompressor (ACD)(N, K, V) 800 in accordance with some embodiments described herein. In this embodiment, N=3 is the number of groups of scan chains in one partition, K=6 is the number of mutually orthogonal partitions, and V=6 is the number of shift registers $R_0, R_1, R_2, \ldots, R_{V-1}$. ACD(N, K, V) 800 includes a set of shift registers and a linear network 802 constructed based on K mutually orthogonal partitions specified by the following six formulas: x, [(x+y) mod N], y, [(x+z) mod N], z, [(y+z) mod N]. Linear network 802 is coupled to the set of shift registers $R_0, R_1, R_2, \ldots, R_5$ by sets of wires labeled as $i_{mn}$, wherein m is the index of the register the wire is coupled to and n is the index of the specific sequential element in register $R_m$ the wire is coupled to.

In one embodiment, the procedure (Procedure 2) for synthesizing a circular decompressor may include the following steps:
1) assign a unique triplet to each scan chain (x, y, z) where x, y, z={0, 1, 2, ..., N−1};
2) assign a unique index {0, 1, 2, ..., N−1} to each sequential element in each shift register based on its position in the corresponding shift register;
3) assign a unique formula (a partition) to shift register R, for i=0, 1, ..., 5; and
4) couple each scan chain (x, y, z) to one sequential element in each shift register such that the value of the corresponding formula determines the index of the sequential element.

Note that the above decompressor synthesis procedure creates a linear network 802 between a set of scan chains (not shown) and the set of shift registers, wherein linear network 802 has $N^3$ outputs and KN inputs such that the inputs are divided into groups of N inputs $\{I_0, I_1, \ldots, I_{K-1}\}$ associated with shift registers $\{R_0, R_1, \ldots, R_{K-1}\}$ of length N, respectively. A decompressor range of an ACD(N, K, V) is N shift cycles, and any three scan cells are linearly independent within the decompressor range when K≥4. In one embodiment, at least four mutually orthogonal partitions, for example, {x, y, (x+y) mod N, z}, are required to construct an ACD in order to satisfy this condition. For N is an odd number and K=6, any four scan cells in one shift cycle are linearly independent.

Figure 9:
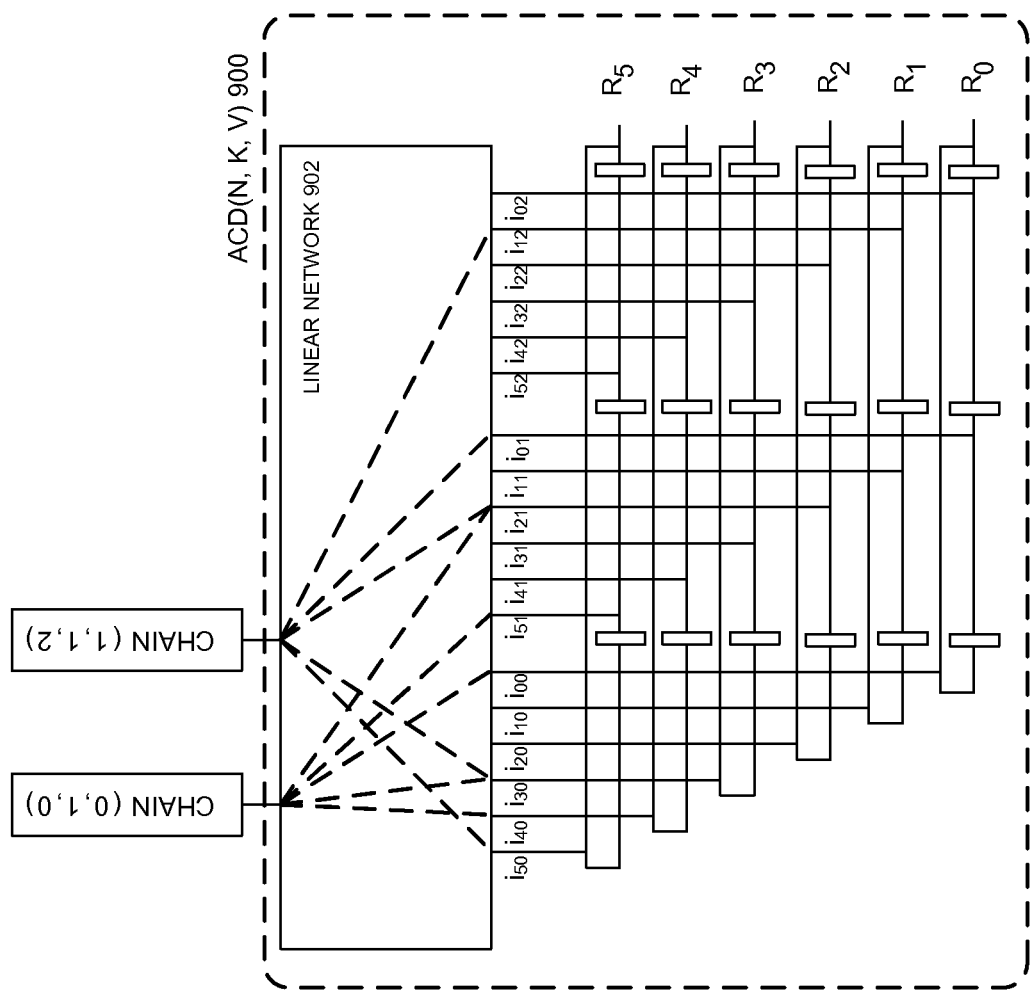
FIG. 9 presents a block diagram of a modified augmented circular decompressor ACD(N, K, V) in accordance with some embodiments described herein.

FIG. 9 presents a block diagram of a modified ACD(N, K, V) 900 in accordance with some embodiments described herein. In this embodiment, N=3 is the number of groups of scan chains in one partition, K=6 is the number of mutually orthogonal partitions, and V=6 is the number of shift registers. However, the modified ACD(N, K, V) 900 includes a set of shift registers and a linear network constructed based on 7 mutually orthogonal partitions specified by the following formulas: x, [(x+y) mod N], y, [(x+z) mod N], z, [(y+z) mod N], [(x+y+z) mod N]. In one embodiment, the procedure (Procedure 3) for synthesizing a circular decompressor may include the following steps:
1) assign a unique triplet (x, y, z) to each scan chain, wherein x, y, z={0, 1, 2, ..., N−1};
2) assign a unique index {0, 1, 2, ..., N−1} to each sequential element based on its position in the corresponding shift register;
3) assign a unique formula: x, [(x+y) mod N], y, [(x+z) mod N], z, [(y+z) mod N] to shift register $R_i$ (i=0, 1, ..., 5), respectively;
4) couple each scan chain (x, y, z) to one sequential element in each shift register such that the value of the corresponding formula determines the index of the sequential element; and
5) decouple scan chain (x, y, z) from shift register $R_i$ where i=(x+y+z) mod G and G is the larger of {N, K}.

For example, the resulting connections determined by the synthesis procedure 3 are illustrated for scan chain (0, 1, 0) and scan chain (1, 1, 2) in FIG. 9 as a linear network 902. Note that for the modified ACD(N, K, 6), any three scan cells in the decompressor range are linearly independent when N≥2 and K≥4. Moreover, for N is odd and K=6, any four scan cells in one shift cycle are linearly independent. The above-described decompressor design technique provides a significant reduction in linear dependency between four and more scan cells in the decompressor range.

Figure 10:
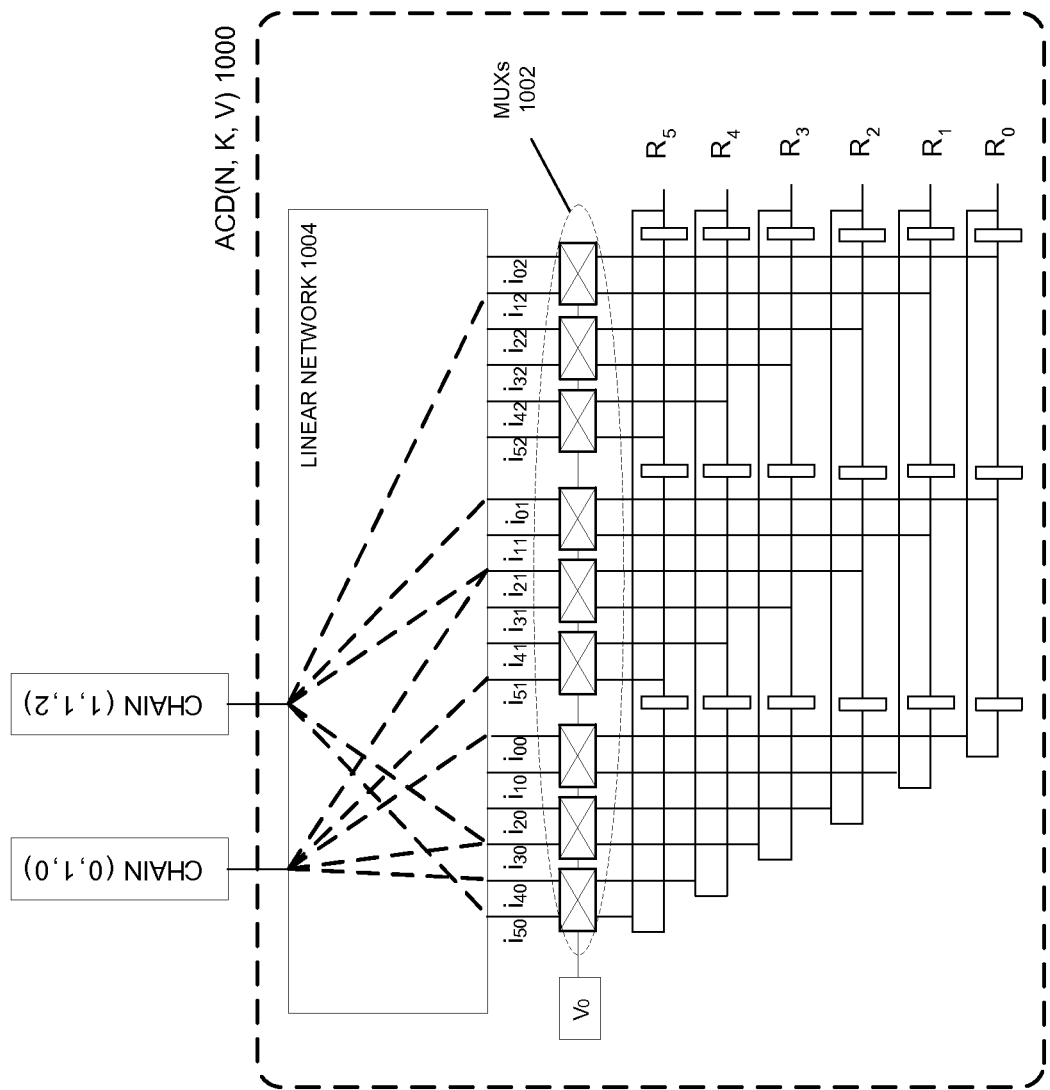
FIG. 10 presents a block diagram of an enhanced ACD(N, K, V) in accordance with some embodiments described herein.

FIG. 10 presents a block diagram of an enhanced ACD(N, K, V) 1000 in accordance with some embodiments described herein. Again, N=3 is the number of groups of scan chains in one partition, K=6 is the number of mutually orthogonal partitions, and V=6 is the number of shift. As illustrated in FIG. 10, the enhanced ACD(N, K, V) 1000 is constructed based on the modified ACD(N, K, V) 900 by adding a set of MUXs 1002 for swapping shift registers $R_0$ with $R_1$, $R_2$ with $R_3$, and $R_4$ with $R_5$ before coupling them to linear network 1004. Note that the swapping operation is controlled by an extra variable $v_0$. More specifically, when $v_0$=0, the groups of inputs $I_0, I_1, \ldots, I_5$ of linear network 1004 receive test data from shift registers $R_0, R_1, R_2, R_3, R_4, R_5$, respectively. When $v_0$=1, the groups of inputs $I_0, I_1, \ldots, I_5$ of linear network 1004 receive test data from shift registers $R_1, R_0, R_3, R_2, R_5, R_4$, respectively.

For N is odd, N≥5, and K=6, the enhanced ACD(N, K, V) 1000 guarantees that any four scan cells within the decompressor range are linearly independent when $v_0$ is either 0 or 1. Moreover, the set of shift registers can be divided into two groups $\{R_0, R_2, R_4\}$ and $\{R_1, R_3, R_5\}$ such that the first group of shift registers is associated with three partitions defined by three formulas {x, y, z} and the second group of shift registers is associated with three partitions defined by three formulas {[(x+y) mod N], [(x+z) mod N], [(y+z) mod N]}. Any combination of three swapping pairs between the first group and the second group of shift registers guarantees that any four scan cells within the decompressor range are linearly independent either with or without a swapping operation. In other words, an intersection of linearly dependent quadruplets of scan cells with and without swapping is empty. To support the decompressor design in FIG. 10, the static encoding process assigns variables $v_1, v_2, \ldots, v_{nk}$ to sequential elements in the shift registers $R_0, R_1, \ldots, R_5$. Consequently, two systems of linear equations can be derived and processed to reflect the presence and absence of a swapping operation during the ATPG, respectively. The state of variable $v_0$ is determined based on the first encoding conflict. This feature allows further improvement in the encoding efficiency of the decompressor scheme. An advanced decompressor scheme based on this feature may include independent control of a set of MUX's for swapping a pair of shift registers as well as per shift cycle control for swapping operation. More specifically, the advanced decompressor scheme may include a 3-bit counter such that each bit of the 3-bit counter controls swapping operation of one of the three pairs of shift registers. An initial state of the 3-bit counter is determined by the state of variable $v_0$ and the state of the 3-bit counter is increased for each shift cycle.

Figure 11:
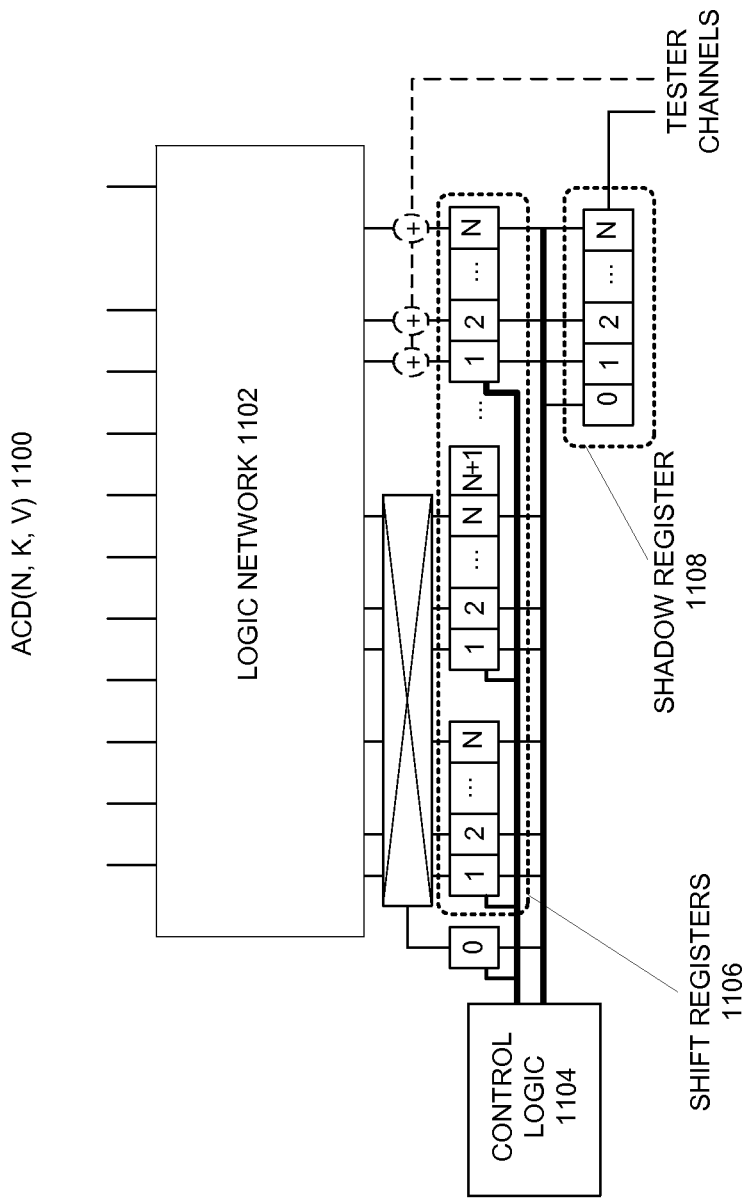
FIG. 11 presents a block diagram of an ACD(N, K, V) which allows selective partial reseeding in accordance with some embodiments described herein.

FIG. 11 presents a block diagram of an ACD(N, K, V) 1100 which allows selective partial reseeding in accordance with some embodiments described herein. As illustrated in FIG. 11, the ACD 1100 comprises a logic network 1102, control logic 1104, and a set of V reconfigurable shift registers 1106 of length that is at least N and having a single feedback loop such that reconfigurable shift registers 1106 selectively receive test data as needed from a shadow register 1108 of length N+1. The purpose of shadow register 1108 is to decouple shifting test data in the scan chains and the reconfigurable shift registers. Consequently, the present embodiment allows shifting compressed test data in shadow register 1108 with a different (usually higher) speed while shifting decompressed test data in the scan chains.

Additionally, ACD(N, K, V) 1100 may have one or more streaming tester channels wherein each one of such channels provides one test data bit per shift cycle. As a result, the decompressor design in FIG. 11 provides three mechanisms for supplying test data bits from a tester: (1) all reconfigurable shift registers can be reseeded in one shift cycle; (2) one or more reconfigurable shift registers can be selectively reseeded as needed; and (3) one test data bit for each streaming channel per shift cycle. Note that mechanisms (1) and (2) provide similar flexibility under the assumption that 0 or all reconfigurable shift registers can be reseeded in one shift cycle. Meanwhile, mechanisms (2) and (3) have similar flexibility under the assumption that S reconfigurable shift registers are reseeded after each N shift cycles where S is the number of streaming channels. While mechanisms (1) and (3) have similar flexibility as mechanism 2 under certain restrictions, mechanism (2) typically provides the highest flexibility among the three mechanisms for supplying test data from a tester.

Figure 12:
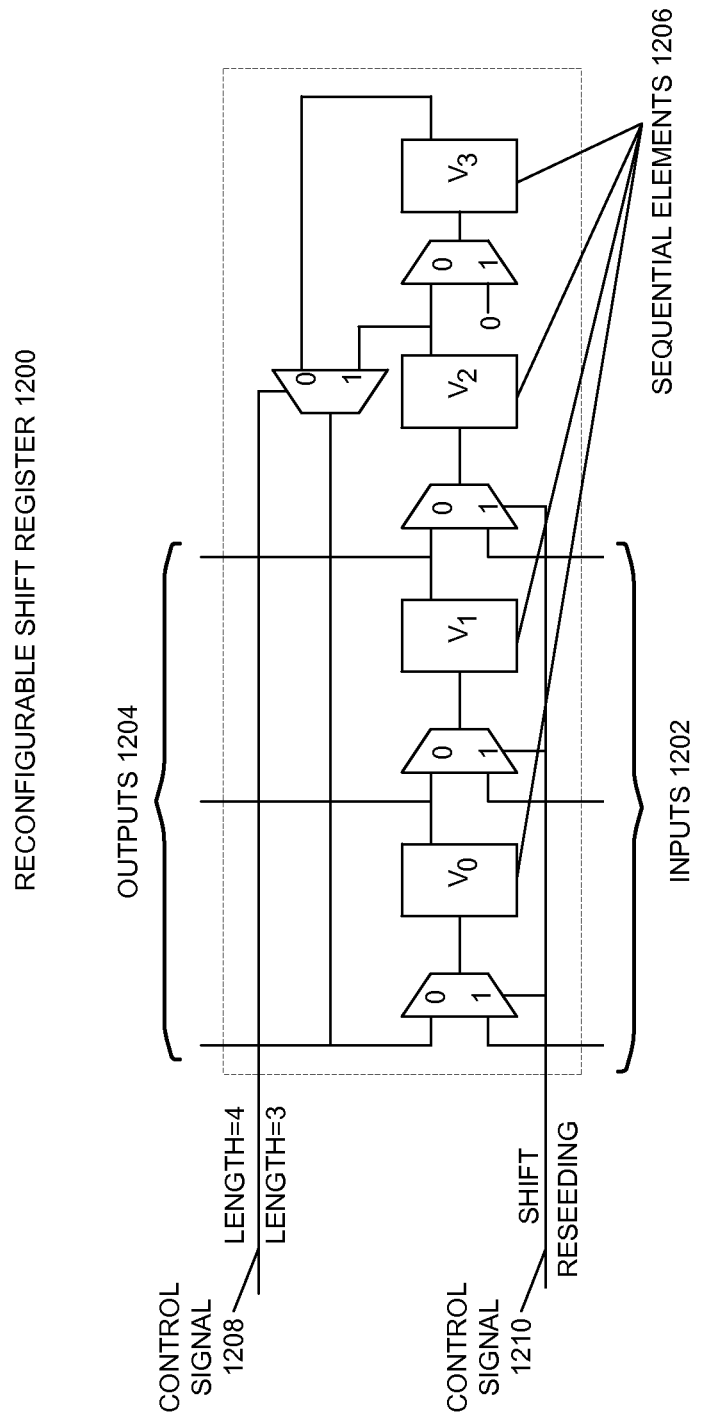
FIG. 12 illustrates an exemplary reconfigurable shift register for N=3 in accordance with some embodiments described herein.

FIG. 12 illustrates an exemplary reconfigurable shift register 1200 for N=3 in accordance with some embodiments described herein. As illustrated in FIG. 12, reconfigurable shift register 1200 includes: N parallel inputs 1202, N parallel outputs 1204, (N+1) sequential elements 1206, and two control signals 1208 and 1210. Control signal 1208 determines that the length of reconfigurable shift register 1200 is either N or N+1. Control signal 1210 determines which operation, either shifting or reseeding, is selected. During a reseeding operation, the states in the parallel inputs 1202 are stored in the first N sequential elements, and state 0 is stored in the last sequential element after each clock pulse. During a shifting operation, the state in the previous sequential element is stored in each sequential element after each clock pulse wherein the previous sequential element of the first sequential element depends on values of control signal 1208.

Assume that all shift registers have the same length N and a single feedback. Also assume that all shift registers shift compressed test data and scan chains shift the decompressed test stimulus with the same speed. As a result, the decompressor range is N and the generated test sequence is repeated after N shift cycles under the assumption that all shift registers are reloaded once per pattern. The decompressor range may be increased using one of the following approaches: 1) at least one shift register is reconfigured to selectively change its length to N and $N_1$, wherein N and $N_1$ are relative prime; 2) at least one shift register can be selectively reseeded; 3) at least one pair of shift registers supports the swapping operation discussed in conjunction with FIG. 10; 4) at least one shift register is reconfigured to selectively change an order of sequential elements; 5) at least one shift register is reconfigured to selectively change the shifting speed with respect to the shifting speed of scan chains; and 6) two or more shift registers are reconfigured to form a single shift register having at least one feedback loop. Consequently, a set of decompressor commands may include the following instructions for one or more reconfigurable shift registers: 1) disable/enable reload operation; 2) disable/enable changing length (the number of sequential elements); 3) disable/enable reseeding operation; 4) disabled/enable swapping operation; 5) disabled/enable shifting operation; and 6) disable/enable changing an order of sequential elements.

Performance Analysis of an ACD(N, K, V)

Figure 13:
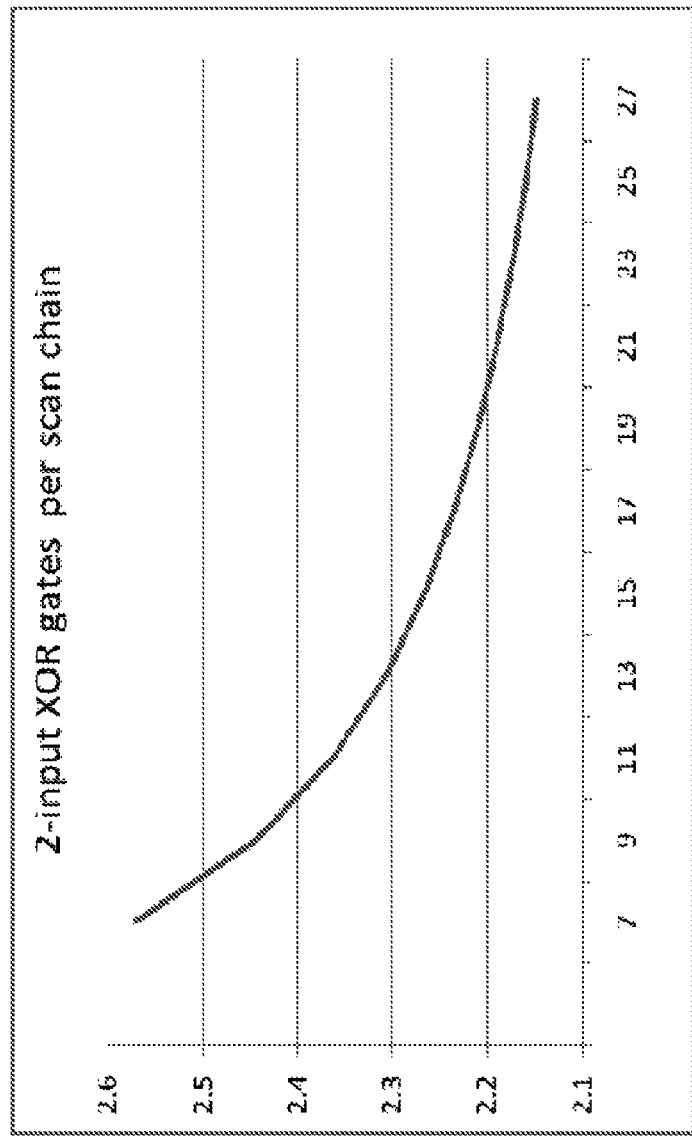
FIG. 13 illustrates an estimated hardware overhead of the modified ACD(N, K, V) based on the number of required 2-input XOR gates in the logic network per scan chain in accordance with some embodiments described herein.

FIG. 13 illustrates an estimated hardware overhead of the modified ACD(N, K, V) (e.g., ACD(N, K, V) 900 in FIG. 9) based on the number of required 2-input XOR gates in the linear network per scan chain in accordance with some embodiments described herein. As is illustrated in FIG. 13, the hardware overhead in the linear network can be minimized by clustering, i.e., connecting each XOR gates of a cluster to different scan chains. For the linear network 802, the mutually orthogonal partitions defined by the following formulas: x, y, [(x+y) mod N] define a cluster of $N^2$ XOR gates such that each XOR gate is coupled to N scan chains having fixed values for parameters x and y while parameter z changes from $0, 1, \ldots, N-1$. As a result, a triplet of shift registers (A, B, C) forms a cluster of $N^2$ XOR gates such that each XOR gate of this cluster is coupled to one sequential element of shift registers A, B and C.

More specifically, let a, b and c be sequential elements belonging to shift registers A, B and C associated with formulas x, y, [(x+y) mod N], respectively. The XOR gate (a, b) of cluster (x, y, x+y) is coupled to the following N scan chains: $\{(a, b, 0), (a, b, 1), (a, b, 2), \ldots, (a, b, N-1)\}$. Accordingly, $2N^2$ 2-input XOR gates are required to implement this cluster in the linear network 802. For the linear network 902, a scan chain (x, y, z) is disconnected from at most one shift register A, B or C. As a result, the set of scan chains $\{(a, b, 0), (a, b, 1), (a, b, 2), \ldots, (a, b, N-1)\}$ may be also connected to clusters (x, y), (x, x+y) and (y, x+y) defined by 2 mutually orthogonal partitions and the respective sets of $N^2$ 2-input XOR gates are coupled to at least 2 sequential elements of shift registers A, B and C. Accordingly, $4N^2$ 2-input XOR gates are required to implement clusters (x, y, x+y), (x, y), (x, x+y) and (y, x+y) for the linear network 902. In addition, $N^2$ 2-input XOR gates are required to implement cluster (z, x+z). The remaining formula [(y+z) mod N] can be treated independently. As a result, each scan chain is coupled to at most 2 clusters and at most one independent shift register which is associated with formula [(y+z) mod N]. Therefore, at most $2N^3$ 2-input XOR gates are required to implement this part of the linear network 902. Accordingly, an upper bound for the hardware overhead of the linear networks 902 can be estimated using the following formula: $2N^3+5N^2$. Also, the hardware overhead of the linear networks 802 can be computed using the following formula: $2N^3+3N^2$. Note that, for large values of N, the hardware overhead is close to two 2-input XOR gates per scan chain.

For K=5, the hardware overhead in the linear networks 802 and 902 will be $N^3+3N^2$ and $N^3+5N^2$, respectively. Note that, for large values of N, the hardware overhead is close to one 2-input XOR gates per scan chain. An impact on encoding property is expected to be negligible since any three scan cells in the decompressor range of the ACD(N, K, V) will still be linearly independent. For K=4, the hardware overhead in the linear networks 802 and 902 will be $N^3+2N^2$ and $N^3+4N^2$, respectively. An impact on encoding property is expected to be moderate since any three scan cells in the decompressor range of the ACD(N, K, V) will still be linearly independent. In general, clusters exist between any two mutually orthogonal partitions. Accordingly, a cluster divides scan chains into $N^2$ equivalence classes such that each equivalence class includes N scan chains. The number of 2-input XOR gates of a cluster is $2N^2$.

As was previously shown, clusters exist for triplets of mutually orthogonal partitions: $\{x, y, [(x+y) \bmod N]\}$, $\{x, z, [(x+z) \bmod N]\}$, $\{x, [(y+z) \bmod N], [(x+y+z) \bmod N]\}, \ldots ,$ $\{z, [(x+y) \bmod N], [(x+y+z) \bmod N]\}$. The remaining triplets of mutually orthogonal partitions form super clusters. Accordingly, a super cluster divides scan chains into $N^3$ equivalence classes such that each equivalence class includes one scan chain. Super clusters are defined by the following mutually orthogonal partitions: $\{x, y, z\}$, $\{x, y, [(x+z) \bmod N]\}$, $\{x, y, [(y+z) \bmod N]\}, \ldots , \{[(x+z) \bmod N], [(y+z) \bmod N], [(x+y+z) \bmod N]\}$. The number of 2-input XOR gates of a super cluster is $2N^3$.

In U.S. Pat. No. 7,584,392, the 3-dimensional version of a linear decompressor is based on super clusters for constructing the conventional combinational decompressors. In U.S. Pat. No. 6,684,109, the method for synthesizing phase shifters with reduced linear dependency does not apply a grouping for sequential elements and it is unlikely to produce a linear network comprising clusters. Therefore, the described clustering approach for synthesizing the linear network of the ACD(N, K, V) is both distinctive and advantageous. This approach can be easily adapted for synthesizing phase shifters of the conventional sequential decompressors having a very high encoding efficiency and minimized routing congestion during physical implementation.

More specifically, the following steps can be used for coupling S scan chains to Q sequential elements: 1) divide sequential elements in K+1 groups such that $N^K<S$ and $N=\lfloor Q/(K+1) \rfloor$; 2) for each k-tuple $(x_0, x_1, x_2, \ldots , x_{k-1})$, generate a combination of K+1 sequential elements belonging to different groups using at least the following formulas: $x_0, x_1, x_2, \ldots , x_{k-1}, (x_0+x_1) \bmod N$, wherein $x_i=\{0, 1, 2, \ldots , N-1\}$ for $i=\{0, 1, 2, \ldots , K-1\}$; and 3) assign a unique k-tuple $(x_0, x_1, x_2, \ldots , x_{k-1})$ to each scan chain based on a set of criteria including linear dependency between scan cells and channel separation. The resulted linear network will have a minimized number of XOR gates and minimized routing congestion. In this sense, an indication for using a clustering approach may include the following steps: 1) partitioning of sequential elements into K groups such that each scan chain is coupled to at most one sequential element in each group; 2) associating each group with a shift register—an ordered set of at least 2 sequential elements; and 3) classifying triplets of shift registers into at least two categories: triplets forming super clusters and triplets forming clusters wherein the number of combinations of three sequential elements for super clusters is expected to be significantly higher than the number of combinations of three sequential elements for clusters.

Figure 14:
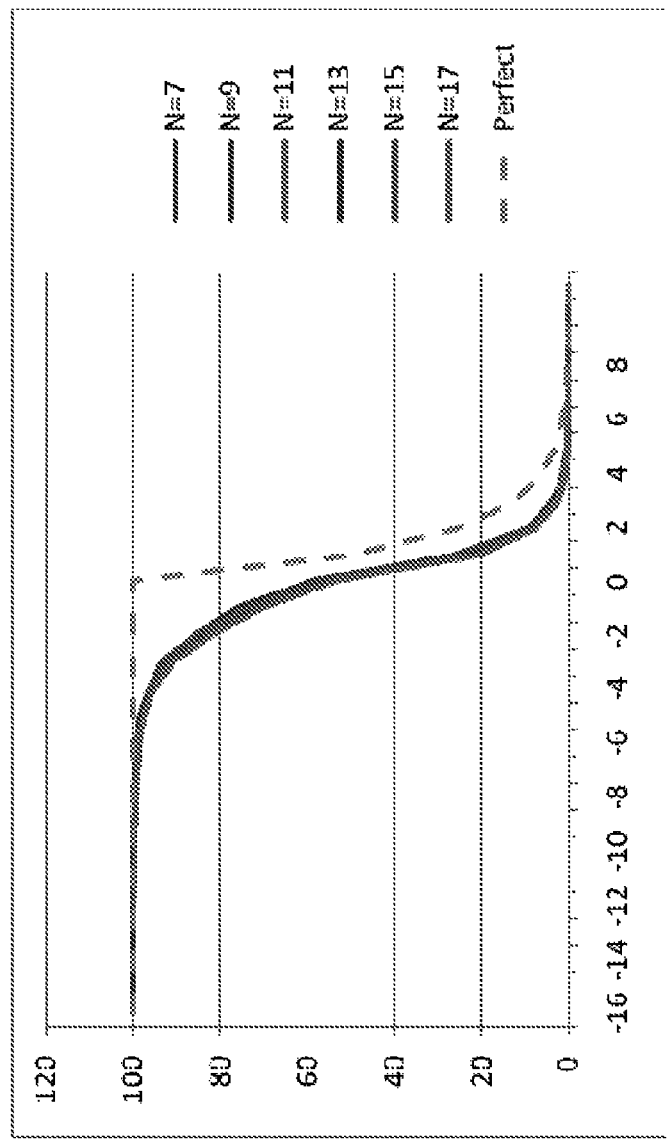
FIG. 14 illustrates an encoding efficiency of the modified ACD(N, 6, 6) within the decompressor range of N shift cycles in accordance with some embodiments described herein.

FIG. 14 illustrates an encoding efficiency of the modified ACD(N, 6, 6) within the decompressor range of N shift cycles in accordance with some embodiments described herein. Note that the encoding efficiency can be defined as a ratio of successfully encoded specified care bits to the total number of test data bits supplied by a tester. The encoding process can include the following steps: 1) assigning a variable to each test data bit; 2) randomly selecting a care bit (a scan cell and its state); 3) deriving a characteristic equation of the current scan cell based on the variables assigned in step 1; 4) forming a system of linear equations including characteristic equations of all selected care bits; 5) solving the system of linear equations using Gauss-Jordan elimination; and 6) if the system of linear equations has a solution going to step 2, otherwise returning an encoding conflict.

For a perfect decompressor without any linear dependency, the first T care bits can always be encoded when T is the number of test data bits (or variables). After this, the encoding probability becomes $0.5^{Q-T}$ wherein Q is the total number of care bits. For an ACD(N, K, V), the encoding efficiency depends on the presence of linearly dependent scan cells. An encoding conflict exists when an odd number of 1's is assigned to a set of linearly dependent scan cells. The data shown in FIG. 14 demonstrates that the ACD achieves encoding efficiency similar to the encoding efficiency of the perfect decompressor.

Figure 15:
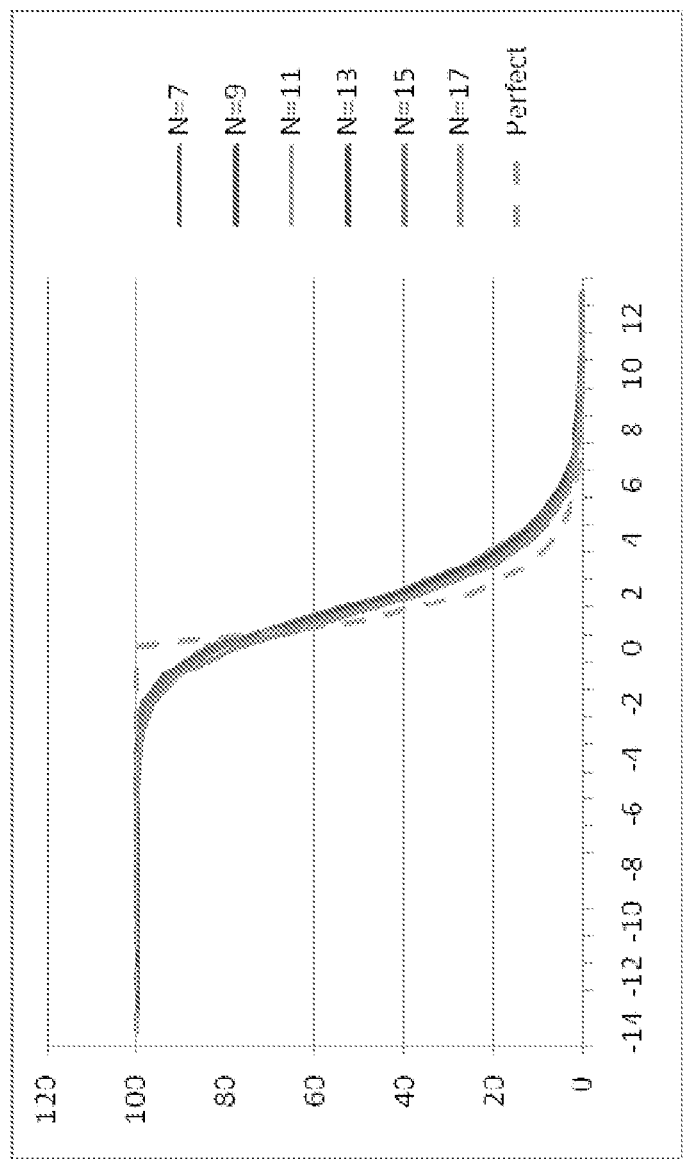
FIG. 15 illustrates an encoding efficiency of the enhanced ACD(N, 6, 6) within the decompressor range of N shift cycles in accordance with some embodiments described herein.

FIG. 15 illustrates an encoding efficiency of the enhanced ACD(N, 6, 6) within the decompressor range of N shift cycles in accordance with some embodiments described herein. The data shown in FIG. 15 demonstrates that the enhanced ACD has a potential to achieve higher encoding efficiency than the perfect decompressor in certain intervals. The average encoding efficiency of the enhanced ACD was in a narrow range between 99.99-100.80 percent. Moreover, the minimum number of encodable care bits was improved by 2-5 care bits in comparison to the modified ACD illustrated in FIG. 14.

Figure 16:
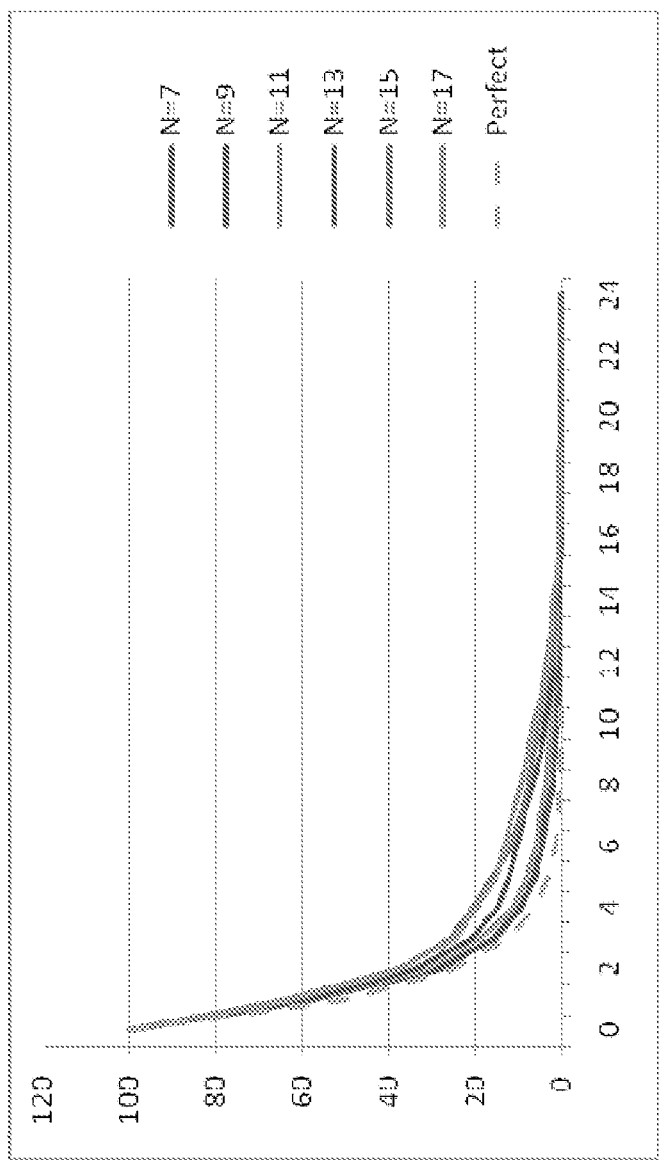
FIG. 16 illustrates an encoding efficiency of the modified ACD(N, 6, 6) within the decompressor range of N shift cycles and having a backtracking limit of 10 in accordance with some embodiments described herein.

FIG. 16 illustrates an encoding efficiency of the modified ACD(N, 6, 6) within the decompressor range of N shift cycles and having a backtracking limit of 10 in accordance with some embodiments described herein. Generally, test generation involves making decisions to accomplish certain goals. More specifically, each decision may involve one or more state assignments (assigning states to signals) and an implication process that needs to find most of the necessary state assignments as a result of each decision. A conflict may exist because the implication process is typically not capable of finding all necessary state assignments in a reasonable time during the ATPG. Similarly, the static encoding process is executed for each care bit and checks that all specified care bits are encodable. The static encoding process is capable of deriving some necessary assignments due to a dependency of the decompressor, but it is incapable of deriving all necessary assignments. Consequently, an encoding conflict may exist but may be treated like all other conflicts during the ATPG. The simulation results demonstrate that the minimum number of encoded care bits always exceeds the number of supplied test data bits with a small backtracking limit under an assumption that all conflicts during the ATPG are treated in the same way.

Figure 17:
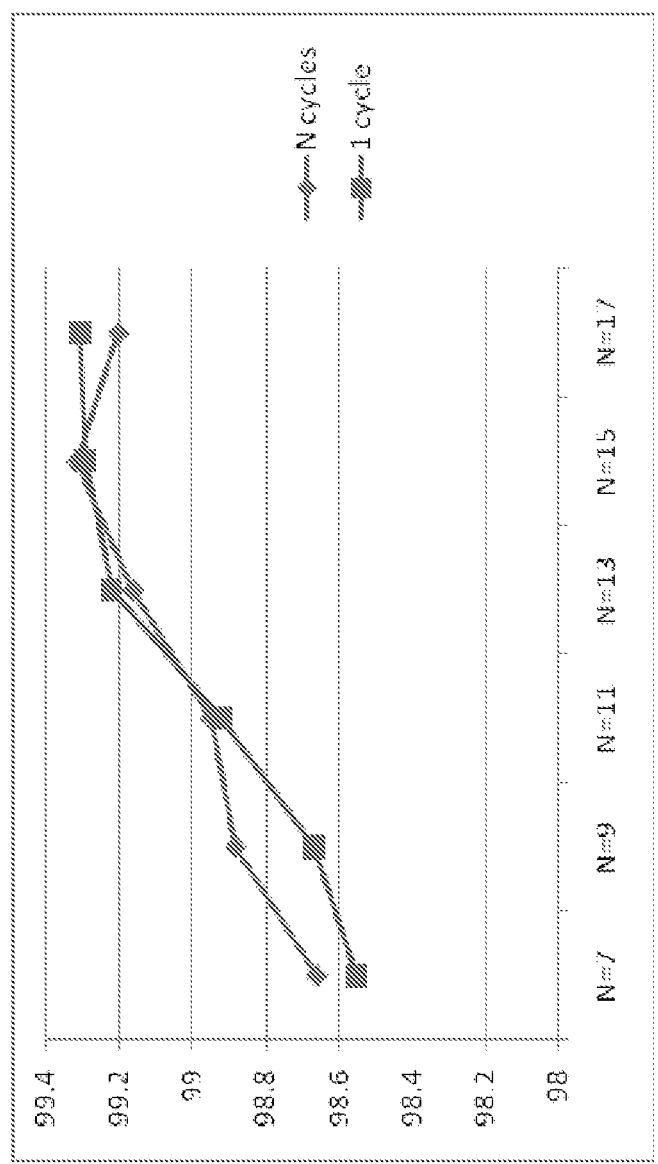
FIG. 17 illustrates a comparison between the average encoding efficiency of the modified ACD(N, 6, 6) in 1 and N shift cycles in accordance with some embodiments described herein.

FIG. 17 illustrates a comparison between the average encoding efficiency of the modified ACD(N, 6, 6) in 1 and N shift cycles in accordance with some embodiments described herein. Note that an important goal of the compression schemes is to achieve very high compression ratio between the number of scan chains and the size of the decompressor scheme determined by the total length of shift registers. It can be seen that increasing the compression ratio has a positive impact on test application time and switching activities (power dissipation in test mode). However, increasing the compression ratio also increases the number of specified care bits in one shift cycle that may result in an inability of the decompressor scheme to successfully encode all care bits within one shift. Note that none of the discussed advantageous features is useful to resolve this limitation. In this case, achieving a similar encoding efficiency in a single shift cycle and N shift cycles becomes an adventurous feature of the present circular decompressor design.

Figure 18:
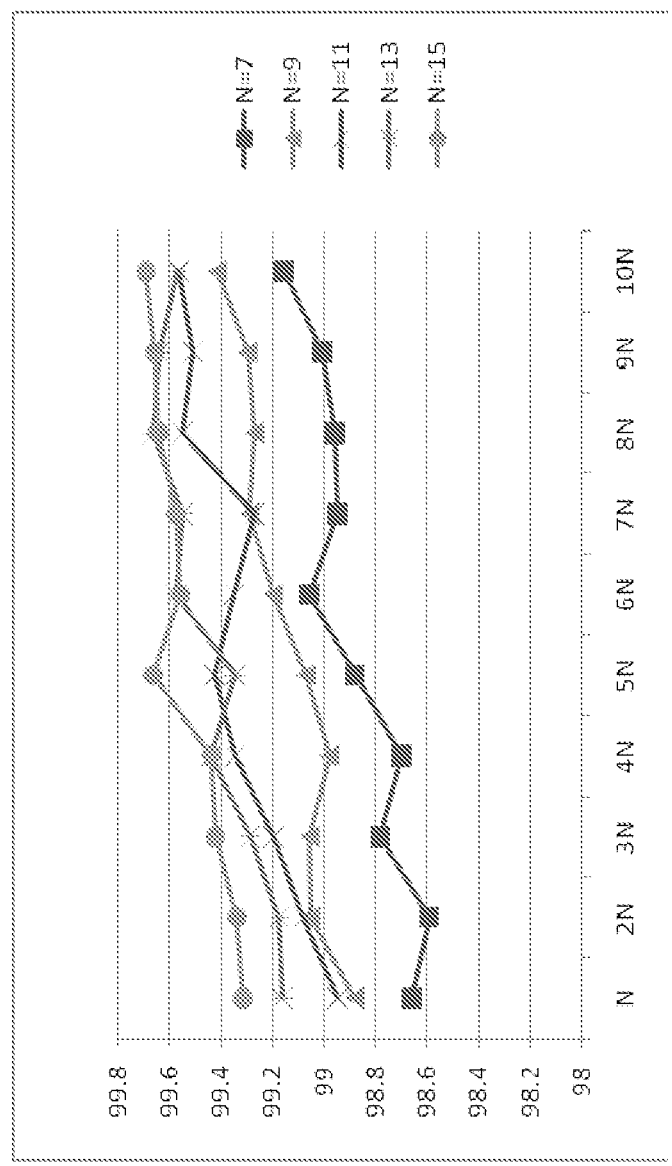
FIG. 18 illustrates an average encoding efficiency of the modified ACD(N, 6, 6) under the restriction that one pre-selected shift register may be reseeded every N shift cycles in accordance with some embodiments described herein.

FIG. 18 illustrates an average encoding efficiency of the modified ACD(N, 6, 6) under the restriction that one pre-selected shift register is reseeded every N shift cycles in accordance with some embodiments described herein. The simulation data illustrated in FIG. 18 demonstrates an ability of an ACD to effectively incorporate the encoding process (dependencies of the decompressor scheme) in an ATPG implication process. More specifically, an encoding process identifies most necessary assignments for a specified care bit which effectively reduces non-solution area in test generation, decreases the probability of encoding conflicts and improves merging additional (secondary) faults in one test pattern. If the encoding process is capable of identifying all necessary assignments for each care bit, then the next care bit is always encodable. In the present embodiment, each sequential element of the pre-selected shift register may be associated with a group of $N^3$ scan cells within an interval of N consecutive shift cycles. Accordingly, the decompressed test stimulus can be viewed as a superposition of two test sequences: periodic (static) and streaming (dynamic) as was discussed in conjunction with FIG. 5. Other possible ATPG scenarios can include: 1) reseeding is disabled and the compression range is increased by increasing the length of one or more shift registers in order to achieve maximum test data reduction (no reseeding); 2) one or more shift registers are reseeded per N shift cycles (dynamic partial reseeding); 3) one or more shift registers are reseeded as needed (selective partial reseeding); and 4) a two-phase process wherein for a primary fault, the ATPG process has no constraints for the amount of supplied test data from a tester, while reseeding is disabled for merging secondary faults.

Figure 19:
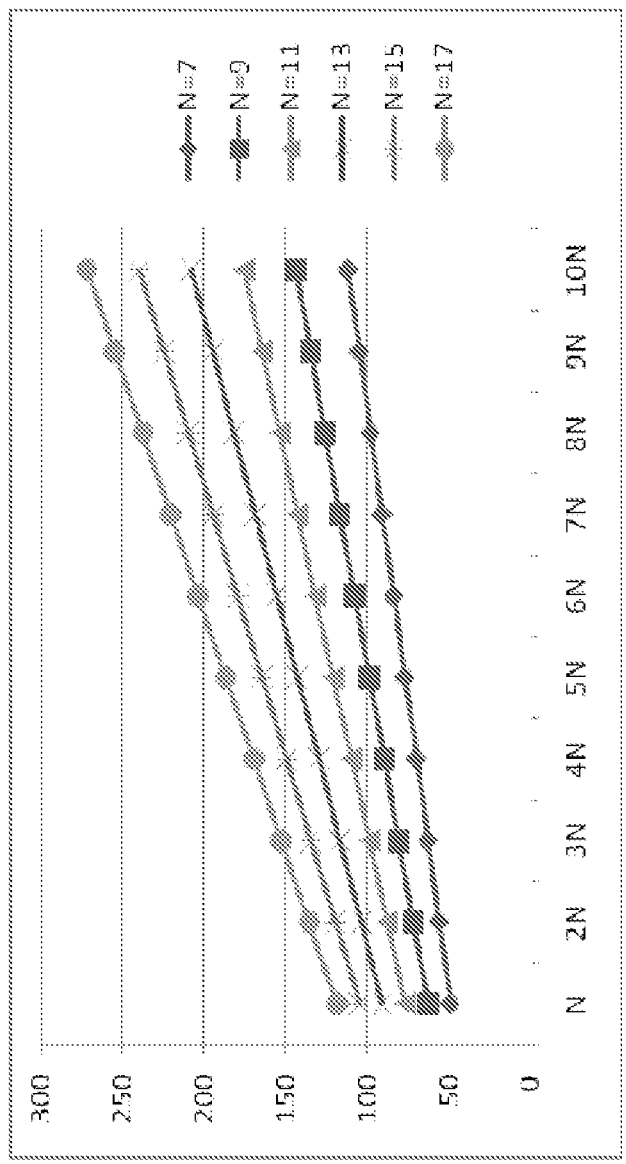
FIG. 19 illustrates the number of test data bits of the modified ACD(N, 6, 6) under the restriction that a pre-selected shift register is reseeded every N shift cycles in accordance with some embodiments described herein.

FIG. 19 illustrates the number of test data bits of the modified ACD(N, 6, 6) under the restriction that a pre-selected shift register is reseeded every N shift cycles in accordance with some embodiments described herein. The simulation data illustrated in FIG. 19 demonstrates an ability of the ACD to provide more test data bits while maintaining an efficient implication process during the ATPG. The amount of test data can be further increased by reseeding more than one shift register every N shift cycles. Accordingly, the encoding process includes two phases: 1) the first phase associated with the first 6N care bits such that a care bit is unlikely to imply other necessary assignments; and 2) the second phase occurring after the first encoding conflict wherein all scan cells in the first N shift cycles are assigned to a specific state and each consecutive care bit implies $N^3$, $N^2$ or N necessary assignments when one, two or three shift registers are reseeded every N shift cycles, respectively.

Figure 20:
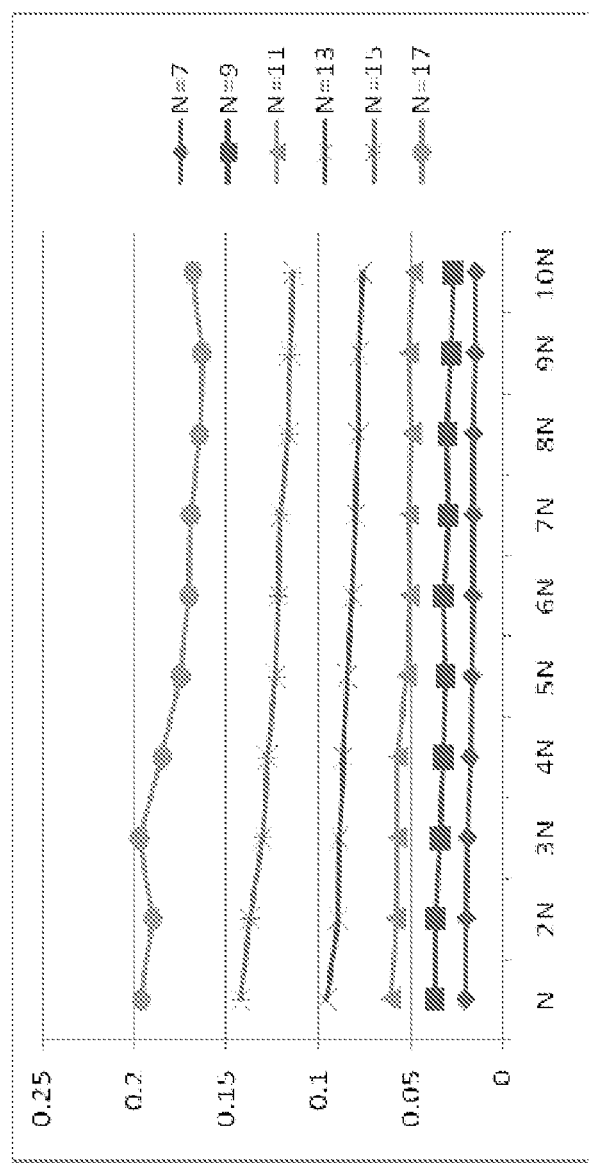
FIG. 20 illustrates an average CPU time in milliseconds per test data bits of the modified ACD(N, 6, 6) under the restriction that one pre-selected shift register may be reseeded every N shift cycles in accordance with some embodiments described herein.

FIG. 20 illustrates an average CPU time in milliseconds per test data bits of the modified ACD(N, 6, 6) under the restriction that one pre-selected shift register may be reseeded every N shift cycles in accordance with some embodiments described herein. The simulation data illustrated in FIG. 20 demonstrates that increasing the test data bits supplied by a tester actually does not increase the computational complexity for the encoding process, and the overall computational complexity strictly depends on the size of the decompressor that is equal to the lengths of all shift registers. In other words, the overall computational complexity of the encoding strictly depends on the number of static variables that is equal to the number of test data bits (static variables) in an initial seed. This result can be explained by splitting the encoding process at least two processes: static and dynamic. More specifically, the decompressor scheme is designed in a way that under certain conditions the variables may be partitioned into at least two sets, static and dynamic, that may be treated independently. This approach allows increasing the amount of test data bits without increasing the number of variables for the static encoding process having a dominant impact on the computational complexity. The number of variables is 6N while the number of test data bits is $6N+S\times N\times[L/N]$ where L is the length of scan chains and S is the number of reseeded shift registers per N shift cycles. For example, let N=17, L=170 and S=2, then the number of static variables is 102 and the number of dynamic variables is 340 while the number of test data bits is 102+340=442. A decompressor constructed based on this scheme can decompress the test stimulus to a design having up to 4913 scan chains, including up to 853210 scan cells. The CPU time for both static and dynamic encoding processes is expected to be around one second, which is considered a reasonable time for such a design size. In U.S. Pat. No. 6,327,687, both static and dynamic variables supplied by a tester are used in forming a system of linear equations. As a result, the computational complexity for solving the system of linear equations increases exponentially with respect to the number of the variables (supplied test data bits). In this way, it becomes infeasible to directly incorporate the encoding process into the ATPG implication process since the number of variables is large. As a result, the implication process does not fully utilize the degree of freedom in the ATPG. This limitation is resolved by some embodiments described herein by partitioning variables in to at least two sets that can be treated independently. As is illustrated by FIG. 20, this approach significantly reduces the computational complexity of the encoding process that allows the encoding process to be directly incorporated into the implication process. As a result, the enhanced implication process fully utilizes the degree of freedom in the ATPG. More specifically, multiple test cubes may satisfy detection criteria for a given fault. Some test cubes may be unencodable while other may be encodable. If the solving of system of linear equations (or encoding) is applied at the end of test generation for a given fault then there is always a risk the generated test cube may be unencodable. Therefore, reducing the computational complexity of the encoding process while improving the overall encoding efficiency is an important feature of some embodiments described herein. In this sense, the dynamic encoding process discussed in conjunction with FIG. 5 and FIG. 7 is a distinctive and advantageous feature of some embodiments described herein. More specifically, the dynamic variables associated with the dynamic encoding process have a limited scope of N shift cycles while the static variables associated with static encoding process have unlimited scope and they are valid until the next seed is loaded. As a result, the computational complexity per test data bit for the dynamic encoding process is expected to be N, $N^2$ or $N^3$ when one, two or three per-selected shift registers are reseeded every N shift cycles, respectively.

Hybrid Decompressor

Figure 21A:
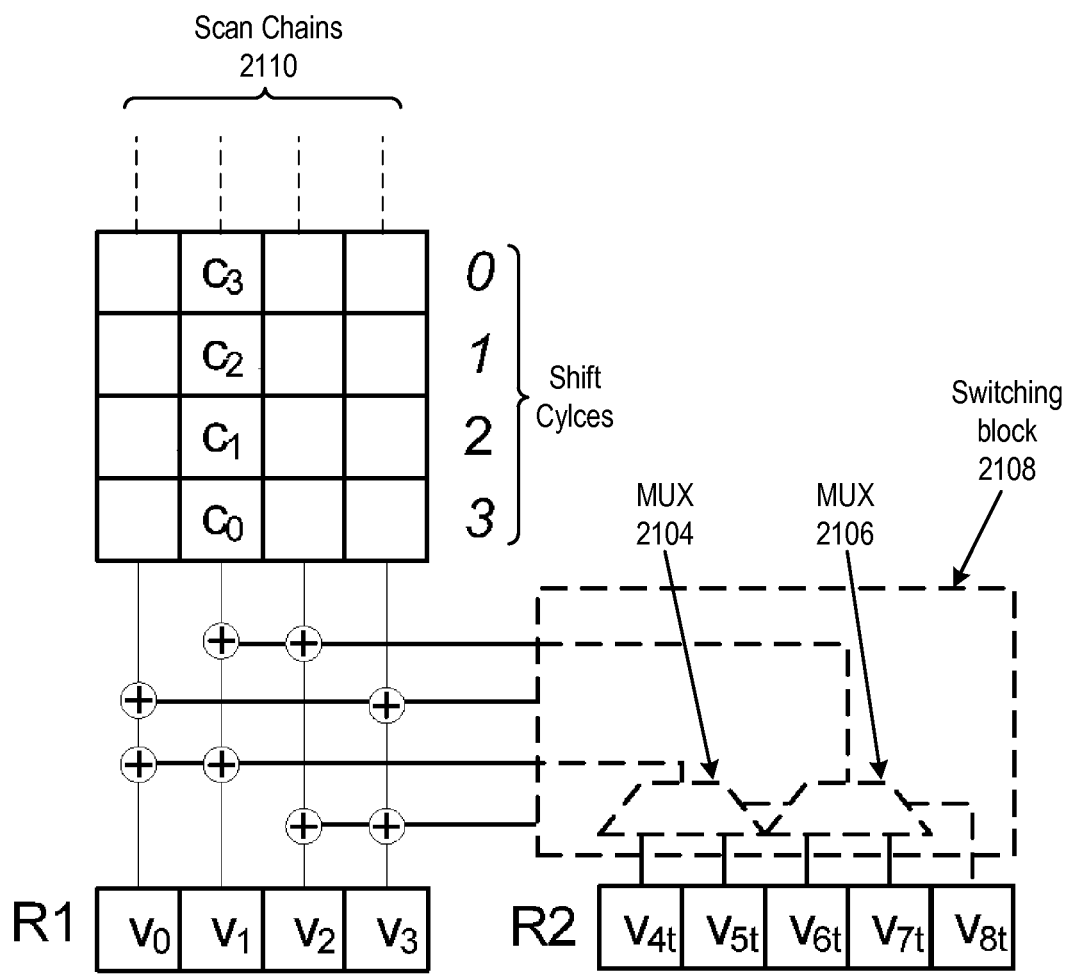
FIG. 21A illustrates a hybrid decompressor in accordance with some embodiments described herein.

FIG. 21 illustrates a hybrid decompressor in accordance with some embodiments described herein. The logic network shown in FIG. 21 couples scan chains 2110 with registers $R_1$ and $R_2$. The logic network includes multiplexers 2104 and 2106 that are controlled by bit $v_{8t}$ in register $R_2$. Register $R_1$ periodically receives static variables from the tester, and register $R_2$ is a shift register that receives dynamic variables from the tester by one or more streaming channels. Switching block 2108 (comprising multiplexers 2104 and 2106) is coupled to register $R_2$ and enables dynamic relations between scan cells in scan chains 2110 and dynamic variables $v_{4t}$-$v_{8t}$. For example, in FIG. 21, care bits $c_0$, $c_1$, $c_2$, and $c_3$ depend on static variable $v_1$, and on all dynamic variables $v_{4t}$-$v_{8t}$. This feature is advantageous because it reduces the number of tester pins required and also reduces the computational complexity of the encoding process of the augmented decompressor.

Augmented Decompressor

Figure 22:
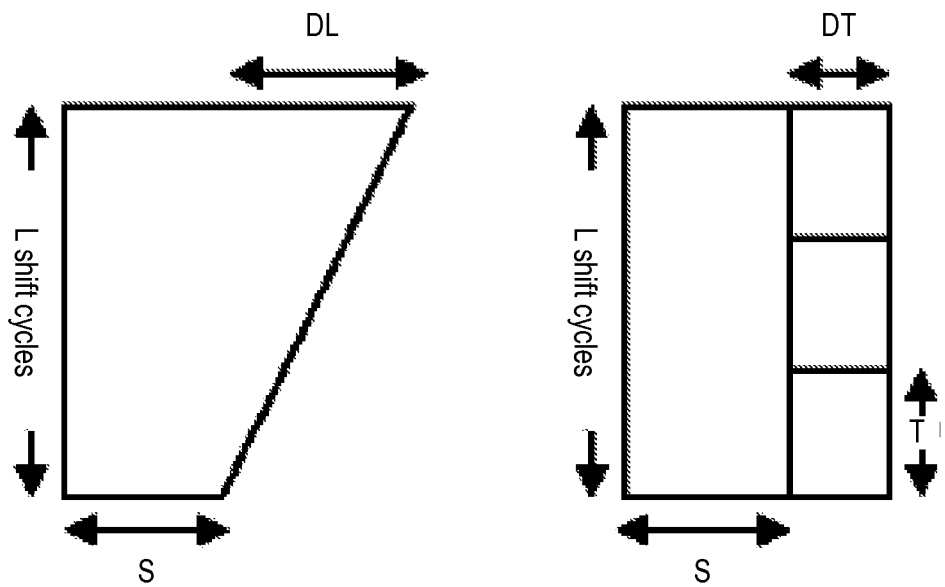
FIG. 22 illustrates encoding diagrams of dynamic and enhanced dynamic reseeding in accordance with some embodiments described herein.

Decompressors based on dynamic reseeding receive S static variables per pattern and DL dynamic variables where L is the length of scan chains. Further details on such decompressors can be found in C. V. Krishna, A. Jas, and N. A. Touba, "Test Vector Encoding Using Partial LFSR Reseeding," *Proc. Int. Test Conf.*, pp. 885-893, 2001, and J. Rajski, J. Tyszer, M. Kassab, and N. Mukherje, "Embedded Deterministic Test," IEEE Trans. On Computer-Aided Design, vol. 23, no. 5, pp. 776-792, May 2004, both of which are herein incorporated by reference in its entirely for providing details of decompressor based on dynamic reseeding. The static variables are available for encoding care bits in any shift cycle and each dynamic variable is available after certain shift cycle. In other words, mixing static and dynamic variables increases flexibility of using these variables in the encoding process. Next, a linear encoding maps a set of variables $V=\{V_0, V_1, \ldots, V_{n-1}\}$ from the tester to a set of care bits $C=\{c_0, c_1, \ldots, C_{m-1}\}$ which is also referred to as a test cube. The test cube is encodable if and only if a system of linear equations $A.V=C$ has a solution where A is an n×m characteristic matrix which specifies all constraints of the decompressor scheme. The computational complexity of the conventional linear encoding is of the order of $O(mn^2)$. The computational complexity of the linear encoding can be greatly reduced if dynamic variables have a limited scope T wherein T<<L. This approach enables an identification of encoding conflicts during ATPG branch-and-bound search. FIG. 22 illustrates encoding diagrams of dynamic reseeding and enhanced dynamic reseeding in accordance with some embodiments described herein. Specifically, the right hand-side of FIG. 22 shows encoding diagram of the dynamic reseeding, and the left hand-side of FIG. 22 shows encoding diagram of an enhanced dynamic reseeding.

Figure 23:
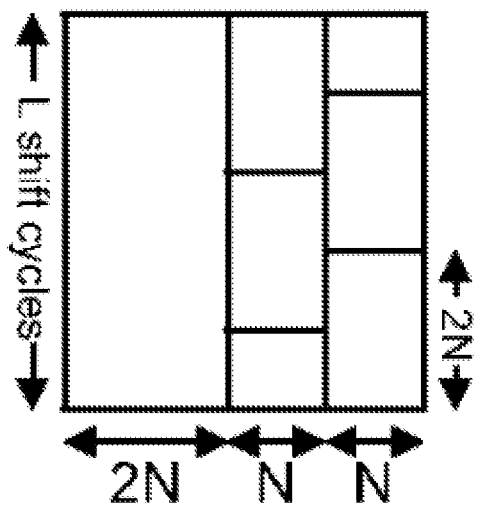
FIG. 23 illustrates an encoding diagram of the augmented decompressor ADC(N,4) for D=1 in accordance with some embodiments described herein.

The basic concepts for constructing augmented time compactors are introduced in E. Gizdarski, "Construction and Analysis of Augmented Time Compactors," Journal of Electronic Testing, Vol. 27, No 2, pp. 109-122, 2011, which is herein incorporated by reference in its entirety. An augmented decompressor, ADC(N,4), consists of four registers of length N which are configured as circular shift registers. Each of up to $N^3$ scan chains is coupled to one bit of each register in a way that all scan cells within N consecutive shift cycles are linearly independent. All registers receive 2N-bit static seed per pattern and registers $R_2$ and $R_3$ receive 2N-bit dynamic seed each N shift cycle through 2N-bit shadow register where D is the number of streaming tester channels/number of dynamic variables per shift cycle. The purpose of the shadow register is to transform streaming data from the tester into 2N-bit seeds. Using the right hand-side encoding diagram shown in FIG. 22, the encoding diagram for this case has S-bit static seeds and DT-bit dynamic seeds. Preferably, S={2N,4N}, DT=2N, S mod N=0, DT mod N=0 and L mod T=0 where N is the length of each register, T is the scope of dynamic seeds and L is the length of scan chains. FIG. 23 illustrates an encoding diagram of the ADC(N,4) for D=1 in accordance with some embodiments described herein. Accordingly, registers $R_0$ and $R_1$ receive 2N-bit static seed per pattern and each of registers $R_2$ and $R_3$ receives N-bit dynamic seed per 2N shift cycles through an N-bit shadow register.

An encoding algorithm of the ADC(N,4) includes two steps: an initial encoding and a final encoding. The goals of the initial encoding are to identify the encoding conflicts as early as possible during branch-and-bound search and to calculate the static seeds based on the static care bits. The initial encoding also needs to derive all necessary cell assignment to improve efficiency of the dynamic pattern compaction. The goal of the final encoding is to calculate dynamic seeds based on dynamic care bits when ATPG is completed.

Let a dynamic equation of each scan cell be calculated by removing all static variables in its characteristic equation. Next, the scan cells are divided into groups such that: (i) scan cells in a group have identical dynamic equations; and (ii) each set of linearly dependent groups includes one dependent group and all other groups are independent.

Initial encoding: The initial encoding is based on static variables and it includes two phases: unconstrained encoding and constrained encoding. During the unconstrained encoding, each care bit is considered independent and it does not imply values of other scan cells. The unconstrained encoding continues until most of static variables are assigned to either value 0 or 1. During the constrained encoding, each care bit implies the values of all scan cells in the corresponding group and all dependent groups. The unconstrained initial encoding is based on the following rules: 1) a relevant care bit of an independent group is the first care bit and it determines the characteristic equation of this group; 2) relevant care bits of a dependent group are the first care bits of the corresponding independent groups; and 3) each static care bit and the relevant dynamic care bit(s) are represented in the system of linear equations by one augmented characteristic equation which is calculated as a superposition of their characteristic equations. The resultant system of linear equations represents all decompressor-imposed constraints based on the static variables.

Figure 21B:
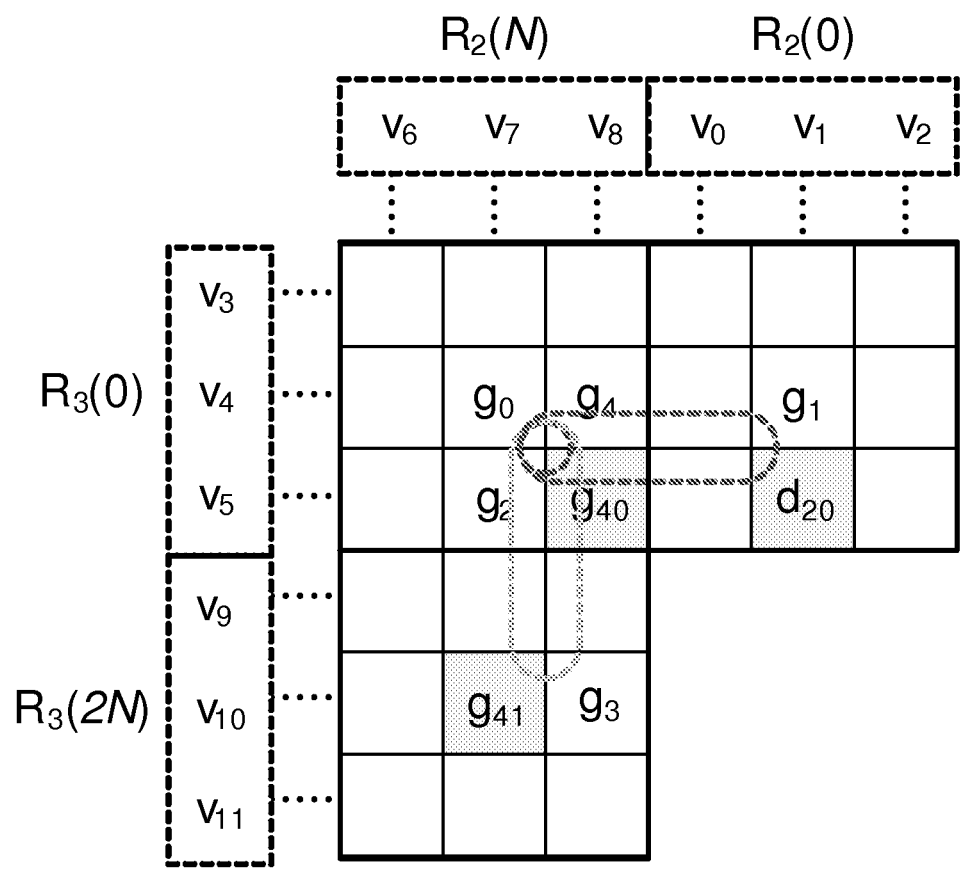
FIG. 21B illustrates an unconstrained encoding using quadruplets in accordance with some embodiments described herein.

FIG. 21B illustrates an unconstrained encoding using quadruplets in accordance with some embodiments described herein. Specifically, FIG. 21B illustrates an unconstrained encoding of the ADC(N,4) for N=3 and D=1. Accordingly, four dynamic seeds $R_2(0)$, $R_3(0)$, $R_2(N)$ and $R_3(2N)$ are loaded in circular registers $R_2$ and $R_3$, in shift cycles 0, N and 2N, respectively. Three time frames need to be considered such that each time frame is associated with a pair of dynamic seeds. Next, each time frame divides scan cells into 9 groups. Let a set of care bits $c_0$, $c_1$, $c_4$ belong to different groups $g_0$, $g_1$, ..., $g_4$, respectively, their indices determine an order of these care bits are specified during ATPG. Next, four groups located at the intersection of a pair of rows and a pair of columns are linearly dependent and form a quadruplet. An encoding conflict exists if and only if a set of linearly dependent groups contains an odd number of 1's. To avoid encoding conflicts, the characteristic equation of the last group of a quadruplet is calculated as a superposition of the characteristic equations the previous three groups. Note that the dynamic equations of groups $g_0$, $g_1$, ..., $g_4$ are linearly independent. As a result, each one of these care bits can be uniquely associated with one dynamic variable (a pivot element) in circular registers $R_2$ and $R_3$. Next, the dependent groups of $g_4$ are labeled as $g_{40}$ and $g_{41}$. Let the characteristic equations of care bit $c_i$ be $f_i(v)=c_i$ for i=(0, 1, ..., 6). Let care bit $c_5$ be the second care bit in group $g_0$ and care bits $c_6$ be the first care bits in dependent group $g_{41}$, respectively. Care bits $c_5$ and $c_6$ are static and they must be included in the system of linear equations.

An augmented characteristic equation of care bit $c_5$ is $f_0(v) \oplus f_5(v) = c_0 \oplus c_5$. The augmented characteristic equation of care bit $c_6$ is $f_0(v) \oplus f_2(v) \oplus f_4(v) \oplus f_6(v) = c_0 \oplus c_2 \oplus c_4 \oplus c_6$. More formally, $c_6$ is the first care bit of dependent group $g_{41}$ of quadruplet $g_0$, $g_3$, $g_4$ and $g_{41}$. Therefore, to avoid encoding conflict, the characteristic equation of dependent group $g_{41}$ is calculated as a superposition of the characteristic equations of previous three groups: $g_0$, $g_3$ and $g_4$. As a result, the augmented characteristic equation of $c_6$ is a superposition of the characteristic equations of $c_6$ and the first care bit of groups $g_0$, $g_3$ and $g_4$, respectively. Note that all augmented characteristic equations include only static variables because dynamic equations of each static care bit and its relevant dynamic care bits are linearly dependent.

Figure 21C:
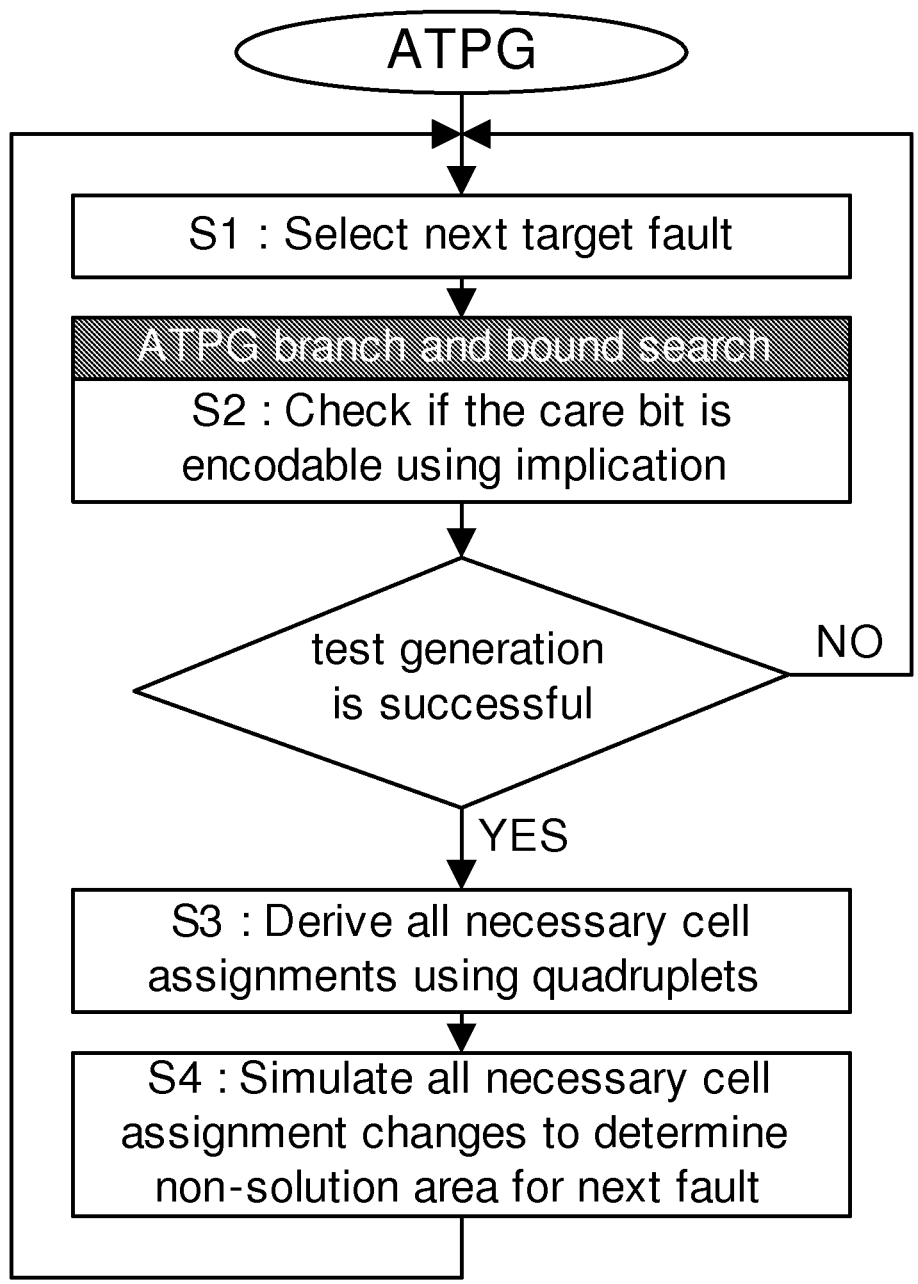
FIG. 21C illustrates a process for performing constrained encoding in accordance with some embodiments described herein.

FIG. 21C illustrates a process for performing constrained encoding in accordance with some embodiments described herein. During the constrained encoding, static seed is already calculated and each care bit determines values of all scan cells in the corresponding group. In S2, encoding conflicts are identified by implication. More formally, dynamic seeds in circular register $R_2$ divide groups into classes such that the first group in each class is directly encodable. Similarly, the second group in each class is represented by augmented dynamic equation which is calculated as supersession of the dynamic equation of the first and second group. Since the augmented dynamic equations always include two dynamic variables of circular register $R_3$ therefore each the augmented dynamic equation can be represented by two implications. For example, the augmented dynamic equation of group $g_2$ is $v_4 \oplus v_5 = c_0 \oplus c_2$. If $c_0 \oplus c_2 = 1$ then the augmented dynamic equation of group $g_2$ is represented by the following two implications: $v_4$ implies $\text{not}(v_5)$ and $v_5$ implies $\text{not}(v_4)$ wherein $\text{not}(\ )$ denotes inversion function (or both variables have different values). If $c_0 \oplus c_2 = 0$ then the augmented dynamic equation of group $g_2$ is represented by the following two implications: $v_4$ implies $v_5$ and $v_5$ implies $v_4$ (or both variables have same value). Note that this method is computationally more efficient than the method based on quadruplets. However, it only identifies but does not prevent encoding conflicts. All necessary cell assignments are derived in S3 after a successful test generation for the current target fault (or fault merging in the current pattern). In S4, the necessary cell assignments are propagated by simulation to determine a non-solution area for next target fault. In this way, dynamic pattern compaction selects next target fault and perform test generation for this fault by taking into account all decompressor-imposed constraints based on all already successfully merged target faults. The above described fault merging process continues until a certain exit condition is satisfied.

Final encoding: The final encoding is based on dynamic variables and it includes the following steps: 1) determine a dynamic equation of each dynamic care bit by substituting all static variables with their values assigned during the initial encoding; 2) assign a random value to one dynamic variable and derive values of as many dynamic variables as possible by implication. Since the dynamic equations always include two dynamic variables therefore all dynamic seeds can be calculated without conflict by implication (based on the above step 2).

In a summary, the above described encoding algorithm of the ADC(N,4) uses the following three methods: divide-and-conquer, implication and quadruplets. The divide-and-conquer method divides a linear encoding into two problems: (i) a linear encoding based on static care bits and static variables; and (ii) a linear encoding based on dynamic care bits and dynamic variables comprising dynamic equations of only two dynamic variables that can be solved using implication or quadruplets. The implication method uses the divide-and-conquer method to reduce encoding conflicts identification to a portion of dynamic care bits and a portion of dynamic variables. In this way, the implication method provides an efficient identification of encoding conflicts that can be incorporated into the branch-and-bound search. The quadruplets provide an efficient mechanism for extraction of all necessary cell assignments for identification of a non-solution area during the dynamic pattern compaction. In this way, during dynamic pattern compaction, the fault merging takes into account all decompressor-imposed constraints based on all already successfully merged target faults for the current test pattern.

As a result, the computational complexity of the encoding is greatly reduced so that it becomes feasible to incorporate the encoding into ATPG implication. This approach enables an early identification of encoding conflicts during the ATPG branch-and-bound search. This advantageous feature together with high encoding flexibility of linear decompressor supports aggressive test data compression. In addition, all necessary cell assignments are identified that determines a non-solution area for dynamic pattern compaction. This advantageous feature improves the efficiency of dynamic pattern compaction. An experimental evaluation of the above described embodiments was performed based on 5 industrial cores with 481K-970K scan cells. The experimental results of the ADC(10,4) for D=1 demonstrates that the augmented decompressor supports aggressive test data compression and efficient dynamic pattern compaction. Test application time reduction (TATR) exceeds 1000× for 3 out of 5 industrial cores. An average TATR is 994×.

Linear Decompressor with Two-step Dynamic Encoding

Prospective decompressor schemes include: a) linear decompressors, and b) non-linear decompressors. An advantage of linear decompressors is a high encoding efficiency, i.e., a ratio of successfully encoded care bits to the total number of deployed test data bits. An advantage of non-linear decompressors is that they support a dynamic encoding where the encoding is incorporated into the ATPG implication process. As a result, a particular test cube is more likely to be successfully encoded by a linear decompressor than an equivalent non-linear decompressor because the linear decompressor has a more diverse output space than the equivalent non-linear decompressor. However, the fact that most faults can be detected by many different test cubes provides an additional degree of freedom to the dynamic encoding for improving dynamic pattern compaction during ATPG.

The most popular sequential linear decompressors are based on static or dynamic reseeding. Decompressor schemes based on dynamic reseeding receive a stream of test data from the tester. From the tester's standpoint, dynamic reseeding provides an elegant solution that enables an efficient usage of the tester bandwidth. Decompressors based on dynamic reseeding typically receive a fixed number of test data bits per pattern which is determined such that both test coverage and test application time are optimized. A challenge for the decompressor schemes using the dynamic reseeding is to maximize the encoding efficiency during ATPG since fewer care bits are typically required at the end of a test pattern set. In contrast, linear decompressors based on static reseeding typically use multiple seeds per test pattern. They can selectively encode as many care bits as needed and maintain reasonably high encoding efficiency. A challenge for the decompressor schemes based on the static reseeding is to minimize time and data overheads because reseeding may delay shift operation. In addition, multiple seeds per pattern method requires a complex scheduling and synchronization. In addition, the decompressor schemes can use a combination of test data, control data and correlations. In particular, the encoding efficiency of plain linear decompressors can reach, at its best, the value of one. The encoding efficiency can be increased above this value based on the fact that many faults may require similar but incompatible test cubes. A test cube clustering divides test cubes into clusters such that the number of incompatible care bits in the test cubes of each cluster is minimized. The test cube clustering uses three test sequences: a parent test sequence and a control test sequence for each cluster of test patterns and an incremental test sequence for each test pattern. The parent and incremental test sequences are responsible for encoding compatible and incompatible care bits, respectively. The control test sequence determines which test sequence (parent or incremental) is used for encoding a particular care bit. The encoding efficiency of the test cube clustering is greatly improved because the control and parent test sequences are valid for a cluster of test patterns. A challenge for these decompressor schemes is to reduce the tester bandwidth because the parent and control test sequences need to be repeated for each test pattern in a cluster.

The dynamic encoding provides an efficient solution for test application time reduction (TATR) and test data volume reduction (TDVR). The dynamic encoding cannot be directly associated with either linear or non-linear decompressors. As explained above, a conventional linear encoding maps a set of variables $V=\{v_0, v_1, \ldots, V_{n-1}\}$ from the tester to a set of care bits $C=\{c_0, c_1, \ldots, C_{m-1}\}$, which is also referred to as a test cube. The test cube is encodable if and only if a system of linear equations $A.V=C$ has a solution where A is an n×m characteristic matrix which specifies all constraints of the decompressor scheme. The computational complexity of the conventional linear encoding is of the order of $O(mn^2)$.

Popular dynamic reseeding schemes have a fixed characteristic equation for each scan cell. In this sense, a major obstacle for incorporating the conventional linear encoding into the ATPG implication process is its computational complexity which can be further magnified by ATPG backtracking.

Figure 24:
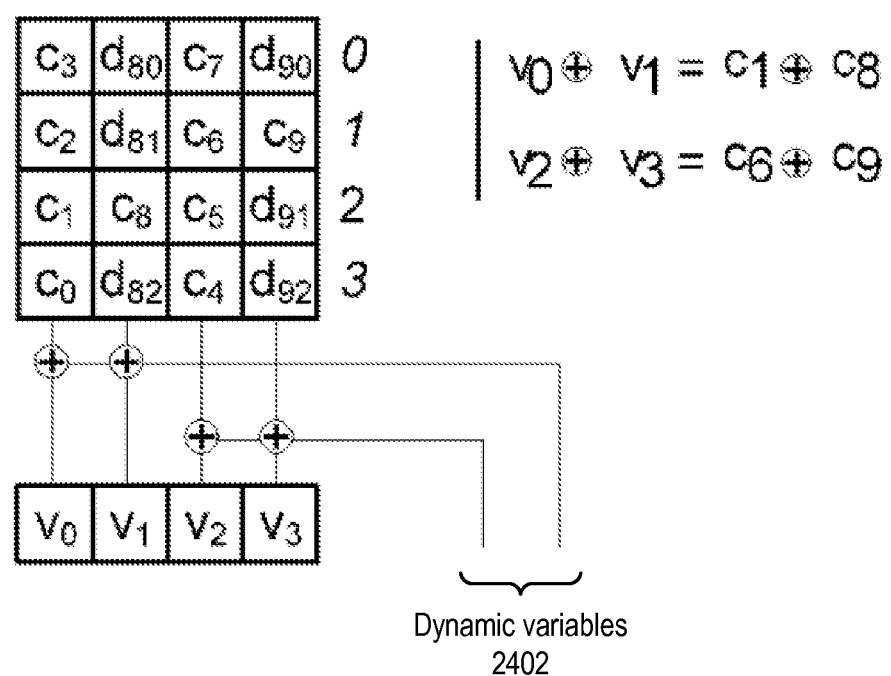
FIG. 24 illustrates a linear decompressor that enables a significant reduction of the computational complexity of the encoding process in accordance with some embodiments described herein.

FIG. 24 illustrates a linear decompressor that enables a significant reduction of the computational complexity of the encoding process in accordance with some embodiments described herein. The linear decompressor is connected to four scan chains of length four and receives four static variables (static seed) per pattern and two dynamic variables 2402 (dynamic seed) per shift cycle. In this way, dynamic variables 2402 divide scan cells into eight groups such that scan cells in each group are uniquely associated with one dynamic variable. For simplicity, let the scan cells of each scan chain also depend on one static variable. The encoding for the described decompressor can be decomposed into two steps based on the following rules: 1) the first care bit of each group is dynamic (or directly encodable) and all other care bits are static (or non-directly encodable); 2) each static care bit and the corresponding dynamic care bit are represented by one augmented characteristic equation which is calculated as a superposition of their characteristic equations. As a result, all care bits are encodable if and only if the system of linear equations including one augmented characteristic equation for each static care bit has a solution. To avoid encoding conflict, the encoding algorithm needs to ensure that all static care bits are encodable with static variable during branch-and-bound search.

Next, all dynamic care bits are encoded based on the dynamic variables after ATPG is completed. Note that an encoding conflict is impossible during this step. In this way, the encoding of the described decompressor is decomposed into two-steps: 1) an initial encoding which is associated with static care bits and static variables; and 2) a final encoding which is associated with dynamic care bits and dynamic variables.

An example of two-step encoding is shown in FIG. 24. Let $c_0, c_1, \ldots, c_9$ be an ordered set of care bits as they are specified during the branch-and-bound search. Clearly, the first eight care bits $c_0, c_1, \ldots, c_7$ are dynamic because each of these care bits can be uniquely associated with one dynamic variable (pivot element) based on the structure of the decompressor scheme. Augmented characteristic equations for static care bits $c_8$ and $c_9$ are shown in FIG. 24. They are calculated by superposition of characteristic equations of care bits $c_1$ and $c_8$ as well as care bits $c_6$ and $c_9$, respectively. Next, more decompressor-constraints can be identified using quadruplets where a quadruplet is a set of four linearly dependent scan cells. For instance, four scan cells in the intersections of a pair of scan chains and a pair of shift cycles form a quadruplet. Implications of care bits $c_8$ and $c_9$ which are derived by quadruplets are denoted as $d_{80}, d_{81}, d_{82}$ and $d_{90}, d_{91}, d_{92}$, respectively. In this way, the quadruplets provide a mechanism for identification of encoding conflict during the branch-and-bound search. The described decompressor can be improved based on the following rules: 1) a scope of dynamic variables is two or more shift cycles; and 2) each scan cell depends on two or more dynamic variables.

Recently, augmented product codes have been successfully used for constructing augmented time compactors. Some embodiments described herein construct linear decompressors that support the two-step encoding which was described in the previous section. A three-dimensional augmented product code, $APC(n^3, 6n)$, considers that $n^3$ information bits (x,y,z) are viewed as a three-dimensional array n×n×n and six sets of parity check bits are calculated based on the following formulas: x, y, z, (x+y) mod n, (x+z) mod n, (y+z) mod n. For odd n≥3, the $APC(n^3, 6n)$ has Hamming distance 6 and each double-bit error produces a unique error syndrome.

One procedure (Procedure 4) for constructing augmented decompressors is as follows. Let $N^3$ scan chains be viewed as an N×N×N data bit array and a unique triplet (x,y,z) be assigned to a chain in row x, column y and block z where N≥2. Augmented decompressor, ADC(N,M), consists of six circular registers $R_1, R_2, \ldots, R_5$ of length n and a linear expander which is constructed by the following six formulas {x, y, z, (x+y) mod N, (x+z) mod N, (y+z) mod N} based on the following steps: (i) assign a unique triplet (x,y,z) to each scan chain where x,y,z take on values from the set {0, 1, 2, ..., N−1}; (ii) assign an index {0, 1, 2, ..., N−1} to flip-flops in each circular register; (iii) assign a unique formula to each circular register Rk where k=(0, 1, ..., 5); (iv) couple each scan chain (x,y,z) to one flip-flop in each circular register such that the value of the corresponding formula determines the index of the flip-flop in each circular register; and (v) decouple scan chain (x,y,z) from circular register Rk if (x+y+z) mod (N+1)=k where k=(0, 1, ..., M−1), k≤N, and M is the number of partially decoupled circular registers.

Figure 25:
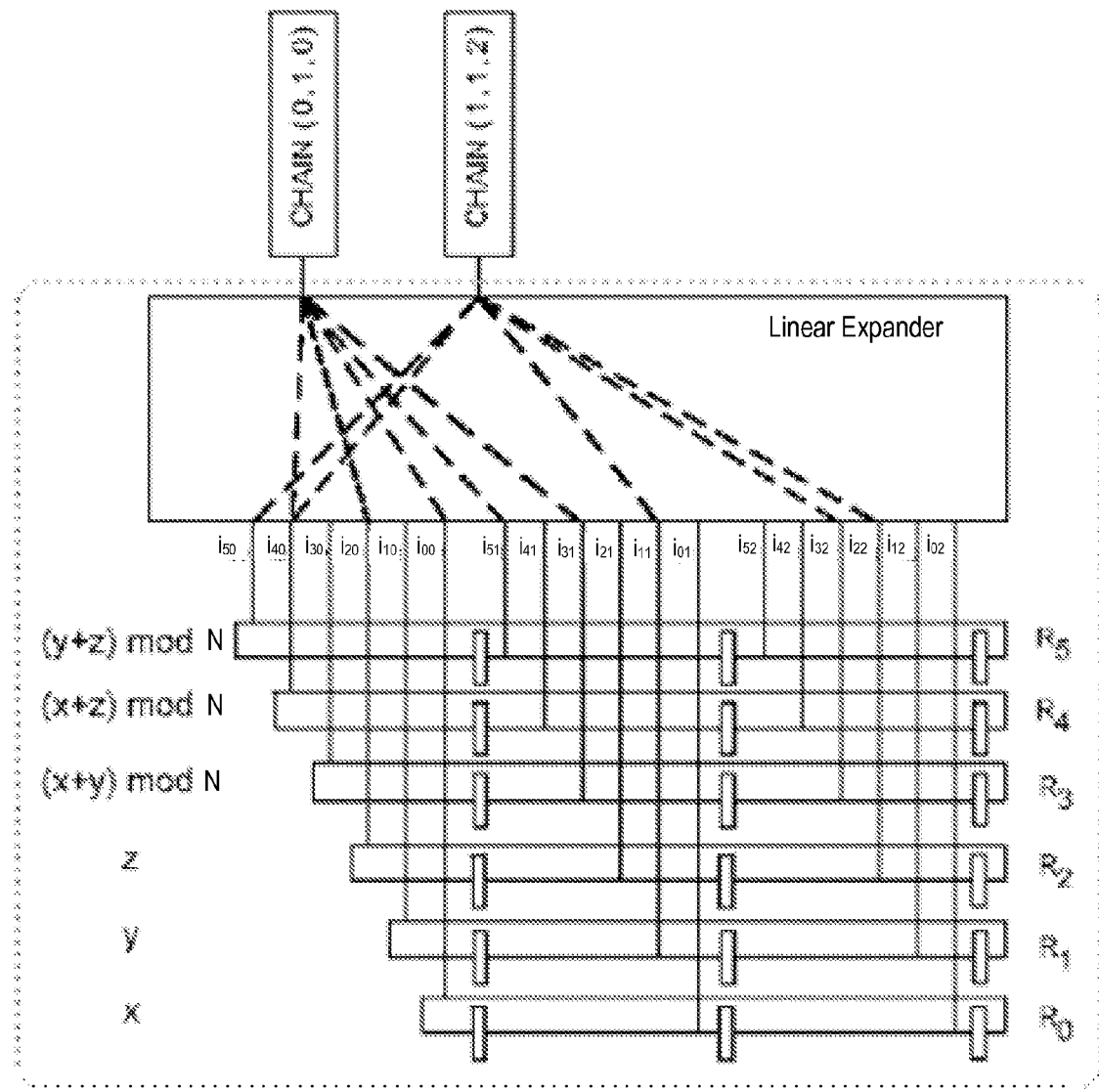
FIG. 25 illustrates a construction of the ADC(3,4) in accordance with some embodiments described herein.

FIG. 25 illustrates a construction of the ADC(3,4) in accordance with some embodiments described herein. First, six circular registers $R_0, R_1, \ldots, R_5$ of length three are uniquely associated with six formulas. Next, triplets (0,1,0) and (1,1,2) are assigned to two scan chains under consideration. A linear expander is constructed by coupling each scan chain to one flip-flop in each circular register such that the value of the corresponding formula determines the index of the flip-flop. The resultant decompressor is denoted as ADC(3,0) and each scan chain is coupled to one flip-flop in each circular register. In step (v), scan chain (x,y,z) is decoupled from circular register Rk if formula (x+y+z) mod 4=k where k<4. In particular case, scan chain (0,1,0) is decoupled from circular register $R_1$ and scan chain (1,1,2) is decoupled from circular registers $R_0$ because (x+y+z) mod 4 equals to 1 and 0, respectively. The resultant decompressor is denoted as ADC(3,4) and it has four partially-decoupled circular registers $R_0$, $R_1$, ..., $R_3$. A calculation of the probability of encoding of the ADC(N,M) for randomly selected care bits within N shift cycles where N=19 and M=(0,2,4,6) clearly demonstrates that the encoding efficiency of the ADC(N,M) improves when M (the number of the partially decoupled circular registers) increases. Next, linear dependency between adjacent scan cells is minimized if adjacent scan chains are coupled to different flip-flops in all circular registers of the ADC(N,M).

Another procedure (Procedure 5) for constructing augmented decompressors is as follows. Linear dependency between adjacent scan cells of the ADC(N,M) is reduced by the following steps: (i) assign an index k=(0, 1 , ..., $N^3$–1) to each scan chain such that a difference between indices of adjacent scan chains is minimized; (ii) assign triplet (x,y,z) of k-th scan chain based on the following formulas: x=k mod N, y=(k/N+k) mod n and z=((k/N+k)/N+k) mod n; (iii) assign an index {0, 1, 2, ..., N–1} to flip-flops of each circular register; (iv) assign a unique step Δi to each circular register Ri such that the length n and the step of the circular register are relatively prime numbers for i=(0, 1, ..., 5); (v) couple j-th flip-flop to k-th flip-flop of circular register Ri if (j+Δi) mod N=k for i=(0, 1, ..., 5) and j=(0, 1, ..., N–1) where k takes on values from the set {0, 1, ..., N–1}; and (vi) execute steps (iii)-(v) of Procedure 4 that was explained above.

The encoding efficiency of the ADC is evaluated based on the following two scenarios for the distribution of care bits: 1) the best-case scenario wherein care bits are randomly generated; and 2) the worst-case scenario wherein care bits fill a rectangle with a side of h scan cells. For the worst-case scenario, the first scan chain is randomly selected and care bits in shift cycles 0, 1, ..., h–1 are encoded one by one followed by care bits in shift cycles 0, 1, ..., h–1 of next scan chain until the first encoding conflict. Experimental results are summarized below for the ADC(19,6).

|  | Random | h = 4 | h = 8 | h = 12 | h = 16 |
| --- | --- | --- | --- | --- | --- |
| Procedure 1 | 99.74 | 23.0 | 28.5 | 40.4 | 54.5 |
| Procedure 2 | 99.79 | 99.9 | 99.2 | 98.5 | 98.0 |

The first column shows the corresponding procedure, the second column shows the encoding efficiency for the best-case scenario and next four columns show the encoding efficiency for the worst-case scenario for h=(4,8,12,16). Based on this experiment, the ADC constructed by Procedure 5 consistently achieves encoding efficiency above 98 percent.

Two observations can be drawn here. Let ADC(N,M) be constructed by Procedure 5 where N is the length of circular registers and M is the number of the partially-decoupled circular registers. For M=3, ADC(N,M,T) denotes that registers $R_0$, $R_1$, ..., $R_3$ receive a static seed from a tester in shift cycle 0 and registers $R_4$ and $R_5$ receive dynamic seeds from tester per T shift cycles where T is a scope of the dynamic seeds. For the ADC(N,M,T), any two scan cells are linearly independent if T≤N.

Figure 26:
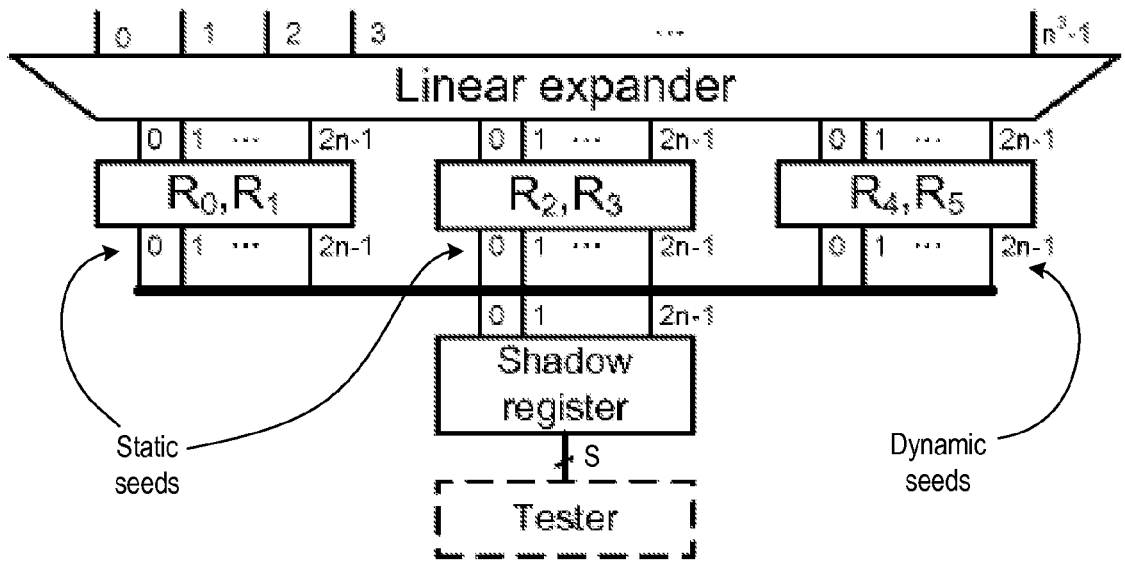
FIG. 26 illustrates an interface between a tester and an augmented decompressor in accordance with some embodiments described herein.

FIG. 26 illustrates an interface between a tester and an augmented decompressor in accordance with some embodiments described herein. The figure shows ADC(N,M,T) where N is the length of circular registers, M is the number of the partially-decoupled circular registers and T is the scope of the dynamic seeds. Test data bits from the tester are serially loaded into 2N-bit shadow register by S tester channels. Circular registers are divided into three pairs. In shift cycle 0, each pair of circular registers receives an initial seed from the 2N-bit shadow register. Next, the third pair of circular registers receives 2N-bit dynamic seed per T shift cycles. For scan configuration K×L, the ADC receives 2N(ceil(L/T)+2) variables per pattern where K is the number of scan chains of length L, and ceil( ) is the ceiling function. The tester bandwidth is optimized if 2N mod S=0 and L mod T=0.

A decompressed test stimulus generated by an embodiment of the decompressor described herein can be viewed as a superposition of two test sequences which are determined based on the static seeds in circular registers $R_0$, $R_1$, $R_2$, $R_3$ and the dynamic seeds in circular registers $R_4$ and $R_5$. To reflect this, the encoding is decomposed into two independent steps: an initial encoding and a final encoding. The goals of the initial encoding are to identify the encoding conflicts as early as possible during branch-and-bound search and to calculate the static seeds based on the static care bits. The goal of the final encoding is to calculate dynamic seeds based on dynamic care bits when ATPG is completed. Let a dynamic equation of each care bit be calculated by substituting all static variables in its characteristic equation. Next, the scan cells are divided into groups such that: (i) scan cells in a group have identical dynamic equations; and (ii) each set of linearly dependent groups includes one dependent group and all other groups are independent.

The initial encoding is based on static variables and it includes two phases: unconstrained and constrained. During the unconstrained encoding, each care bit is considered independent and it does not imply values of other scan cells. The unconstrained encoding continues until the first encoding conflict or all static variables are assigned to either value 0 or 1. During the constrained encoding, each care bit implies the values of all scan cells in the corresponding group and all dependent groups. In this way, all necessary cell assignments are easily identified. This feature is advantageous and it improves the efficiency of dynamic pattern compaction. The unconstrained initial encoding is based on the following rules: 1) a relevant care bit of an independent group is the first care bit and it determines the characteristic equation of this group; 2) relevant care bits of a dependent group are the first care bits of the corresponding independent groups; and 3) each static care bit and the relevant dynamic care bites) are represented in the system of linear equations by one augmented characteristic equation which is calculated as a superposition of their characteristic equations. The resultant system of linear equations represents all decompressor imposed constraints based on the static variables.

The final encoding is based on dynamic variables and it includes the following steps: 1) determine a dynamic equation of each dynamic care bit by substituting all static variables with their values assigned during the initial encoding; 2) for each block of T consecutive shift cycles, encode all dynamic care bits with available 2N dynamic variables where T is the scope of dynamic seeds and N is the length of circular registers.

Note that the scope of the static seeds is one pattern. The scope of the dynamic seeds is T where T=S/2N≤N. Also note that $n^2$ groups are associated with a dynamic seed.

Figure 27:
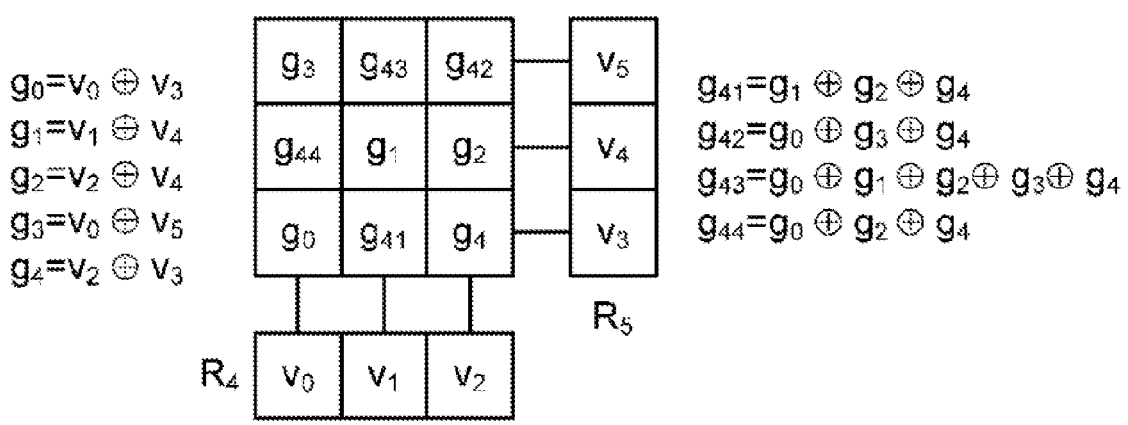
FIG. 27 illustrates an initial encoding of the ADC(N,4,T) for N=3 and T≤N in accordance with some embodiments described herein.

FIG. 27 illustrates an initial encoding of the ADC(N,4,T) for N=3 and T≤N in accordance with some embodiments described herein. For simplicity, let scan chains of a CUT have length of T where T is the scope of dynamic seeds. First, scan cells are divided into 9 groups such that each group is associated with two dynamic variables. Let a set of care bits $\{c_0, c_1, \ldots, c_4\}$ belong to five different groups $\{g_0, g_1, \ldots, g_4\}$ such that the index determines an order of these care bits during ATPG. The left-hand side in FIG. 27 shows the dynamic equations of groups $g_0, g_1, \ldots, g_4$ that are valid for all scan cells in the corresponding group. Note that the dynamic equations of groups $g_0, g_1, \ldots, g_4$ are linearly independent. As a result, each one of these care bits can be uniquely associated with one dynamic variable (a pivot element) of circular registers $R_4$ and $R_5$. Next, four groups located at the intersection of a pair of rows and a pair of columns are linearly dependent and form a quadruplet. An encoding conflict exists if and only if a set of linearly dependent groups contains an odd number of 1's. To avoid encoding conflicts, the characteristic equation of the last group of a quadruplet is calculated as a superposition of the characteristic equations the previous three groups. To illustrate this, the dependent groups of group $g_4$ are labeled as $g_{4j}$ for j=(0, 1, ..., 4). Let the characteristic equations of care bit $c_i$ be $f_i(v)=c_i$ for i=(0, 1, ..., 7). Also, let care bit $c_5$ be the second care bit in group $g_0$ and care bits $c_6$ and $c_7$ be the first and second care bits in dependent group $g_{44}$, respectively.

Care bits $c_5$, $c_6$ and $c_7$ are static and they need to be included in the system of linear equations. An augmented characteristic equation of care bit $c_5$ is $f_0(v) \oplus f_5(v) = c_0 \oplus c_5$. The augmented characteristic equation of care bit $c_6$ is $f_0(v) \oplus f_2(v) \oplus f_4(v) \oplus f_6(v) = c_0 \oplus c_2 \oplus c_4 \oplus c_6$. More formally, $c_6$ is the first care bit of dependent group $g_{44}$ of quadruplet $g_0, g_2, g_4$, and $g_{44}$. Therefore, to avoid encoding conflict, the characteristic equation of dependent group $g_{44}$ is calculated as a superposition of the characteristic equations of previous three groups: $g_0, g_2$, and $g_4$. As a result, the augmented characteristic equation of $c_6$ is a superposition of the characteristic equations of $c_6$ and the first care bit of groups $g_0, g_2$ and $g_4$, respectively. Similarly, the augmented characteristic equation of care bit $c_7$ is $f_0(v) \oplus f_2(v) \oplus f_4(v) \oplus f_7(v) = c_0 \oplus c_2 \oplus c_4 \oplus c_7$. Note that all augmented characteristic equations include only static variables because dynamic equations of each static care bit and its relevant dynamic care bit(s) are linearly dependent. Next, the dynamic equations of dynamic care bits are calculated by a substitution of all static variables in their characteristic equations $f_0(v)=c_0, f_1(v)=c_1, \ldots, f_4(v)=c_4$. During the final encoding, all dynamic care bits within the scope of a dynamic seed form a system of linear equations which includes one equation for each dynamic care bit. The resultant system of linear equations includes 2N dynamic variables and up to 2N−1 equations per dynamic seed.

An experimental evaluation of the above described embodiments was performed based on 10 industrial cores with 115K-481K scan cells. The above-described embodiments outperform the static reseeding method in terms of TDVR for 8 out of 10 industrial cores. The above-described embodiments outperform the static reseeding method in terms of TATR for all industrial cores. The above-described embodiments outperform the static reseeding method in terms of both TATR and pattern count for 7 out of 10 industrial cores. An average TATR/TDVR of the ADC is 247× while the average TATR and TDVR of the static reseeding method is 159× and 213×, respectively.

Figure 28:
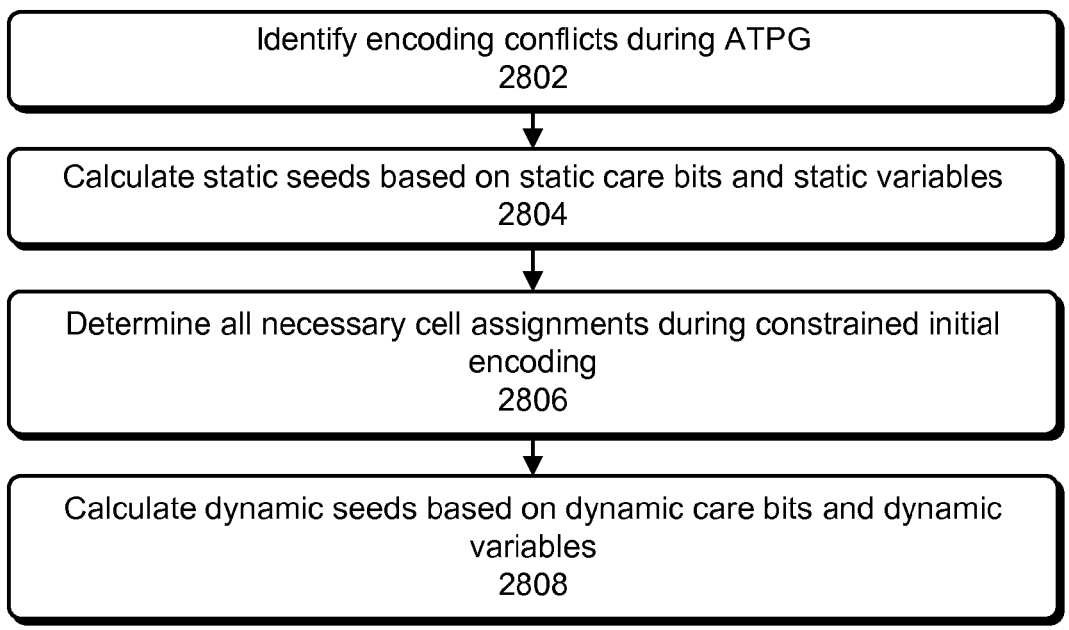
FIG. 28 illustrates a process for performing two-step dynamic encoding in accordance with some embodiments described herein.

FIG. 28 illustrates a process for performing two-step dynamic encoding in accordance with some embodiments described herein. The process can begin by identifying encoding conflicts during ATPG (operation 2802). The process can then calculate static seeds based on static care bits and static variables (operation 2804). Specifically, the process can iteratively represent each static care bit by an augmented characteristic equation until most of static variables are consumed during unconstrained initial encoding. Next, the static seed is calculated and the first care bit of each group determines values of all scan cells for this group. The process can then determine all necessary cell assignments during constrained initial encoding (operation 2806). This advantageous feature improves the efficiency of the dynamic pattern compaction. After ATPG is completed, the process can calculate dynamic seeds based on dynamic care bits and dynamic variables (operation 2808).

To summarize, some embodiments include the following features. Let a k-system is a system of linear equations such that all equations include at most k variables. A k-system is partite if variables can be divided into static and dynamic such that each equation includes at most k-p static variables and at most p dynamic variables where p≤2. The following three operations can be defined. (1) Decomposition: For simplicity let p=1. Let the dynamic variables divide scan cells into non-overlapping groups such that each group depends on one dynamic variable. Let the first care bit in each group be dynamic and all other care bits be static. An operation decomposition divides a partite k-system of all variables into 2(k−1)-system of static variables and a 1-system of dynamic variables such that the 2(k−1)-system includes one augmented characteristic equation for each static care bit which is calculated as a superposition of characteristic equations of the static care bit and the corresponding dynamic care bit. If the resultant 2(k−1)-system has a solution then all care bits are encodable. (2) Implication: Let the 2-system be transformed to an implication graph by replacing each equation with two implications. An operation implication checks that a current care bit is encodable by tracing the resultant implication graph. (3) Quadruplets: Let a partite 2-system be represented by an n×m array of $\{0,1,X\}$. Let four elements at the intersection of a pair of rows and a pair of columns form a quadruplet. An operation quadruplet ensures that a next care bit is encodable by setting the last X element of each quadruplet to either 0 or 1 such that this quadruplet includes even number of 1's.

Figure 29:
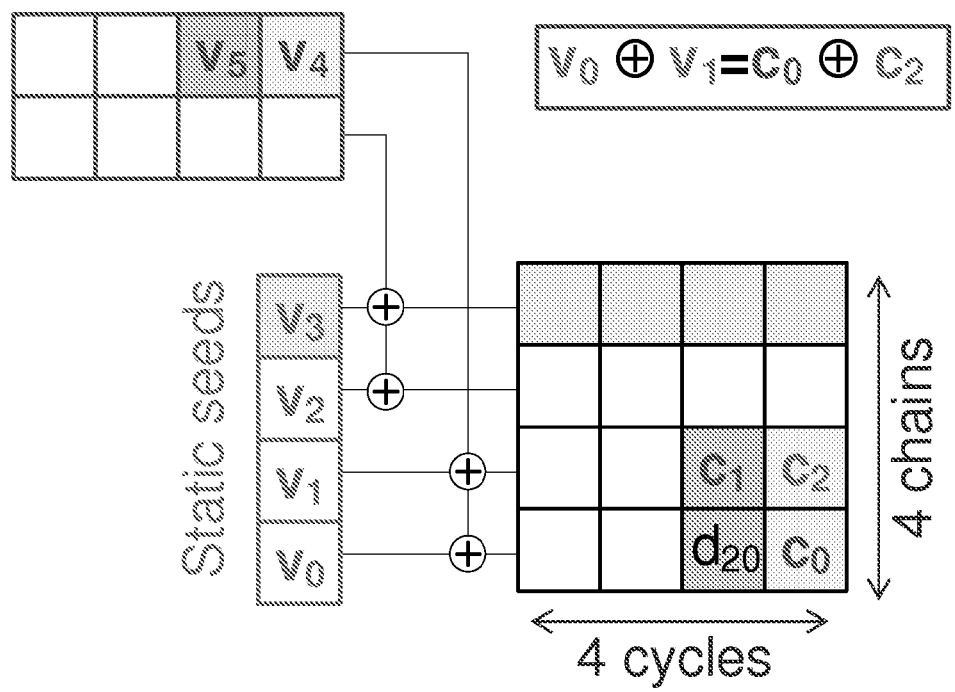
FIG. 29 illustrates an encoding example that uses one static variable and one dynamic variable in accordance with some embodiments described herein.

We now describe an example. For simplicity, let the scan cells of each scan chain also depend on one static variable and one dynamic variable as it is shown in FIG. 29 in accordance with some embodiments described herein. Let $c_0$, $c_1$ and $c_2$ be an ordered set of care bits. Clearly, care bits $c_0$ and $c_1$ are dynamic can be uniquely associated with dynamic variable $v_4$ and $v_5$, respectively, because there are the first care bit in the corresponding group of scan cells. Next, $c_2$ is second care bit of group $v_4$ therefore the 2-system of static variables must include an augmented characteristic equation for static care bit $c_2$. Since all scan cells depend on two variables (one static and one dynamic) therefore all necessary cell assignments can be derived using quadruplets. For example, scan cell $d_{20}$ is the last scan cell of a quadruplet therefore $d_{20} = c_0 \oplus c_1 \oplus c_2$. In a summary, a size of 2-system is reduced form 12 variables (static and dynamic) into 4 variables (static) using decomposition. In addition, all potential encoding conflicts are prevented using quadruplets and next care bit is always encodable.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. In an electronic design automation (EDA) tool, a method for calculating static seeds and dynamic seeds to enable generation of care bits for detecting faults in a circuit under test (CUT), the method comprising:
  receiving an integrated circuit (IC) design that includes a set of registers, a linear expander, and the CUT, wherein the linear expander is capable of generating the care bits based on data stored in the set of registers and scanning the care bits into a set of scan chains in the CUT, wherein the care bits comprise a set of static care bits and a set of dynamic care bits, wherein the static care bits are capable of being encoded by using a first system of linear equations based on static seeds, wherein the dynamic care bits are capable of being encoded by using a second system of linear equations based on dynamic seeds, and wherein the first system of linear equations includes an augmented equation for each static care bit which is capable of being determined by superposing linear equations of the static care bit and at least one corresponding dynamic care bit;
  calculating the static seeds based on the static care bits and the first system of linear equations; and
  calculating the dynamic seeds based on the dynamic care bits and the second system of linear equations.

2. The method of claim 1, wherein the method further comprises identifying encoding conflicts based on the second system of linear equations.

3. The method of claim 1, wherein the method further comprises preventing encoding conflicts based on the second system of linear equations.

4. The method of claim 1, wherein the method further comprises storing the calculated static seeds and dynamic seeds in a database.

5. The method of claim 4, wherein the method further comprises:
  reading the static seeds and the dynamic seeds from the database;
  writing the static seeds and the dynamic seeds to the set of registers; and
  testing the CUT based on the static seeds and the dynamic seeds stored in the set of registers.

6. The method of claim 5, wherein the IC design includes a shadow register, and wherein writing the static seeds and the dynamic seeds to the set of registers comprises iteratively writing each static seed and each dynamic seed into the shadow register, and transferring the contents of the shadow register to a distinct register in the set of registers in each iteration.

7. A non-transitory computer-readable storage medium storing instructions that, when executed by a computer, cause the computer to perform a method for calculating static seeds and dynamic seeds to enable generation of care bits for detecting faults in a circuit under test (CUT), the method comprising:
  receiving an integrated circuit (IC) design that includes a set of registers, a linear expander, and the CUT, wherein the linear expander is capable of generating the care bits based on data stored in the set of registers and scanning the care bits into a set of scan chains in the CUT, wherein the care bits comprise a set of static care bits and a set of dynamic care bits, wherein the static care bits are capable of being encoded by using a first system of linear equations based on static seeds, wherein the dynamic care bits are capable of being encoded by using a second system of linear equations based on dynamic seeds, and wherein the first system of linear equations includes an augmented equation for each static care bit which is capable of being determined by superposing linear equations of the static care bit and at least one corresponding dynamic care bit;
  calculating the static seeds based on the static care bits and the first system of linear equations; and
  calculating the dynamic seeds based on the dynamic care bits and the second system of linear equations.

8. The non-transitory computer-readable storage medium of claim 7, wherein the method further comprises identifying encoding conflicts based on the second system of linear equations.

9. The non-transitory computer-readable storage medium of claim 7, wherein the method further comprises preventing encoding conflicts based on the second system of linear equations.

10. The non-transitory computer-readable storage medium of claim 7, wherein the method further comprises storing the calculated static seeds and dynamic seeds in a database.

11. The non-transitory computer-readable storage medium of claim 10, wherein the method further comprises:
  reading the static seeds and the dynamic seeds from the database;
  writing the static seeds and the dynamic seeds to the set of registers; and
  testing the CUT based on the static seeds and the dynamic seeds stored in the set of registers.

12. The non-transitory computer-readable storage medium of claim 11, wherein the IC design includes a shadow register, and wherein writing the static seeds and the dynamic seeds to the set of registers comprises iteratively writing each static seed and each dynamic seed into the shadow register, and transferring the contents of the shadow register to a distinct register in the set of registers in each iteration.

13. An apparatus, comprising:
  one or more processors; and
  a non-transitory computer-readable storage medium storing instructions that, when executed by the one or more processors, cause the apparatus to perform a method for calculating static seeds and dynamic seeds to enable generation of care bits for detecting faults in a circuit under test (CUT), the method comprising:
    receiving an integrated circuit (IC) design that includes a set of registers, a linear expander, and the CUT, wherein the linear expander is capable of generating the care bits based on data stored in the set of registers and scanning the care bits into a set of scan chains in the CUT, wherein the care bits comprise a set of static care bits and a set of dynamic care bits, wherein the static care bits are capable of being encoded by using a first system of linear equations based on static seeds, wherein the dynamic care bits are capable of being encoded by using a second system of linear equations based on dynamic seeds, and wherein the first system of linear equations includes an augmented equation for each static care bit which is capable of being determined by superposing linear equations of the static care bit and at least one corresponding dynamic care bit;
    calculating the static seeds based on the static care bits and the first system of linear equations; and
    calculating the dynamic seeds based on the dynamic care bits and the second system of linear equations.

14. The apparatus of claim 13, wherein the method performed by the apparatus further comprises identifying encoding conflicts based on the second system of linear equations.

15. The apparatus of claim 13, wherein the method performed by the apparatus further comprises preventing encoding conflicts based on the second system of linear equations.

16. The apparatus of claim 13, wherein the method further comprises storing the calculated static seeds and dynamic seeds in a database.

17. The apparatus of claim 16, wherein the method performed by the apparatus further comprises:
   reading the static seeds and the dynamic seeds from the database;
   writing the static seeds and the dynamic seeds to the set of registers; and
   testing the CUT based on the static seeds and the dynamic seeds stored in the set of registers.

18. The apparatus of claim 17, wherein the IC design includes a shadow register, and wherein writing the static seeds and the dynamic seeds to the set of registers comprises iteratively writing each static seed and each dynamic seed into the shadow register, and transferring the contents of the shadow register to a distinct register in the set of registers in each iteration.

* * * * *